(12) United States Patent
Kato et al.

(10) Patent No.: US 10,347,679 B2
(45) Date of Patent: Jul. 9, 2019

(54) IMAGING DEVICE

(71) Applicant: CANON KABUSHIKI KAISHA, Tokyo (JP)

(72) Inventors: Taro Kato, Tokyo (JP); Fumihiro Inui, Yokohama (JP); Takehiko Soda, Yokohama (JP); Akira Okita, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 71 days.

(21) Appl. No.: 15/589,830

(22) Filed: May 8, 2017

(65) Prior Publication Data

US 2017/0345853 A1 Nov. 30, 2017

(30) Foreign Application Priority Data

May 26, 2016 (JP) .................................. 2016-104823

(51) Int. Cl.
*G02B 7/34* (2006.01)
*H04N 5/232* (2006.01)
(Continued)

(52) U.S. Cl.
CPC ............ *H01L 27/1463* (2013.01); *G02B 7/34* (2013.01); *H01L 27/14612* (2013.01);
(Continued)

(58) Field of Classification Search
CPC ........... H01L 27/1463; H01L 27/14627; H01L 27/14612; H01L 27/14643; H04N 5/359;
(Continued)

(56) References Cited

U.S. PATENT DOCUMENTS

| 7,187,052 B2 | 3/2007 | Okita et al. .................. 257/444 |
| 7,227,208 B2 | 6/2007 | Ogura et al. ................. 257/292 |

(Continued)

FOREIGN PATENT DOCUMENTS

JP 2013-084742 5/2013

OTHER PUBLICATIONS

U.S. Appl. No. 15/358,510, filed Nov. 22, 2016.
U.S. Appl. No. 15/622,595, filed Jun. 14, 2017.
U.S. Appl. No. 15/631,391, filed Jun. 23, 2017.

*Primary Examiner* — Timothy J Henn
(74) *Attorney, Agent, or Firm* — Venable LLP

(57) ABSTRACT

An imaging device includes a plurality of pixels two-dimensionally disposed. At least part of the plurality of pixels includes a first photoelectric conversion unit and a second photoelectric conversion unit provided in a semiconductor substrate and each including a first semiconductor region of a first conductivity type for accumulating a signal charge, a first isolation region provided in the semiconductor substrate between the first photoelectric conversion unit and the second photoelectric conversion unit and including a second semiconductor region forming a first potential barrier for the signal charge in the first semiconductor region, and a second isolation region provided in the semiconductor substrate between the first photoelectric conversion unit and the second photoelectric conversion units and including a trench isolation forming a second potential barrier higher than the first potential barrier for the signal charge in the first semiconductor region.

21 Claims, 13 Drawing Sheets

(51) Int. Cl.
*H04N 5/359* (2011.01)
*H04N 5/378* (2011.01)
*H01L 27/146* (2006.01)
*H04N 5/3745* (2011.01)

(52) U.S. Cl.
CPC .. *H01L 27/14627* (2013.01); *H01L 27/14643* (2013.01); *H04N 5/23212* (2013.01); *H04N 5/359* (2013.01); *H04N 5/378* (2013.01); *H04N 5/37457* (2013.01)

(58) Field of Classification Search
CPC .. H04N 5/3696; H04N 5/37457; H04N 5/378; H04N 5/23212; G02B 7/34
See application file for complete search history.

(56) References Cited

U.S. PATENT DOCUMENTS

| | | | |
|---|---|---|---|
| 7,283,305 B2 | 10/2007 | Okita et al. | 359/619 |
| 7,294,818 B2 | 11/2007 | Matsuda et al. | 250/208.1 |
| 7,321,110 B2 | 1/2008 | Okita et al. | 250/208.1 |
| 7,408,210 B2 | 8/2008 | Ogura et al. | 257/233 |
| 7,456,880 B2 | 11/2008 | Okita et al. | 348/243 |
| 7,460,162 B2 | 12/2008 | Koizumi et al. | 348/294 |
| 7,466,003 B2 | 12/2008 | Ueno et al. | 257/462 |
| 7,514,732 B2 | 4/2009 | Okita et al. | 257/292 |
| 7,531,885 B2 | 5/2009 | Okita et al. | 257/444 |
| 7,538,804 B2 | 5/2009 | Okita et al. | 348/241 |
| 7,538,810 B2 | 5/2009 | Koizumi et al. | 348/308 |
| 7,550,793 B2 | 6/2009 | Itano et al. | 257/239 |
| 7,557,847 B2 | 7/2009 | Okita et al. | 348/308 |
| 7,561,199 B2 | 7/2009 | Noda et al. | 348/308 |
| 7,646,493 B2 | 1/2010 | Okita et al. | 356/620 |
| 7,688,377 B2 | 3/2010 | Matsuda et al. | 348/340 |
| 7,719,587 B2 | 5/2010 | Ogura et al. | 348/302 |
| 7,872,286 B2 | 1/2011 | Okita et al. | 257/291 |
| 7,978,241 B2 | 7/2011 | Koizumi et al. | 348/294 |
| 8,009,213 B2 | 8/2011 | Okita et al. | 348/300 |
| 8,063,958 B2 | 11/2011 | Okita et al. | 348/241 |
| 8,089,545 B2 | 1/2012 | Koizumi et al. | 348/308 |
| 8,106,955 B2 | 1/2012 | Okita et al. | 348/220.1 |
| 8,134,190 B2 | 3/2012 | Okita et al. | 257/292 |
| 8,158,920 B2 | 4/2012 | Suzuki et al. | 250/208.1 |
| 8,159,573 B2 | 4/2012 | Suzuki et al. | 348/294 |
| 8,199,235 B2 | 6/2012 | Okita et al. | 348/301 |
| 8,259,205 B2 | 9/2012 | Noda et al. | 348/294 |
| 8,278,613 B2 | 10/2012 | Okita et al. | 250/214 A |
| 8,349,640 B2 | 1/2013 | Soda | 438/73 |
| 8,390,708 B2 | 3/2013 | Koizumi et al. | 348/294 |
| 8,421,894 B2 | 4/2013 | Koizumi et al. | 348/308 |
| 8,427,567 B2 | 4/2013 | Okita et al. | 348/308 |
| 8,441,558 B2 | 5/2013 | Okita et al. | 348/241 |
| 8,514,309 B2 | 8/2013 | Kato et al. | 348/294 |
| 8,525,896 B2 | 9/2013 | Okita et al. | 348/222.1 |
| 8,553,101 B2 | 10/2013 | Okita et al. | 348/220.1 |
| 8,643,765 B2 | 2/2014 | Takada et al. | 348/340 |
| 8,670,051 B2 | 3/2014 | Kato | 348/272 |
| 8,698,935 B2 | 4/2014 | Okita et al. | 348/314 |
| 8,736,005 B2 | 5/2014 | Kobayashi et al. | 257/432 |
| 8,749,675 B2 | 6/2014 | Koizumi et al. | 348/294 |
| 8,749,683 B2 | 6/2014 | Minowa et al. | 348/308 |
| 8,883,526 B2 | 11/2014 | Okita et al. | 438/24 |
| 8,885,082 B2 | 11/2014 | Noda et al. | 348/294 |
| 8,896,029 B2 | 11/2014 | Koizumi et al. | 257/202 |
| 8,913,166 B2 | 12/2014 | Okita | 348/294 |
| 8,916,917 B2 * | 12/2014 | Furuya | H01L 27/14603 257/213 |
| 8,952,433 B2 | 2/2015 | Inui | 257/292 |
| 8,976,282 B2 | 3/2015 | Soda | 348/302 |
| 9,026,972 B2 | 5/2015 | Soda | 716/120 |
| 9,053,996 B2 | 6/2015 | Iwane et al. | H01L 27/14601 |
| 9,093,345 B2 | 7/2015 | Kato et al. | H01L 27/14641 |
| 9,094,624 B2 | 7/2015 | Shimotsusa et al. | H01L 27/14627 |
| 9,147,708 B2 | 9/2015 | Okita et al. | H01L 27/1461 |
| 9,214,491 B2 | 12/2015 | Okita | H04N 5/347 |
| 9,232,164 B2 | 1/2016 | Minowa et al. | H04N 5/378 |
| 9,257,472 B2 | 2/2016 | Soda | H01L 27/1464 |
| 9,276,027 B2 | 3/2016 | Okita et al. | H01L 27/14812 |
| 9,300,884 B2 | 3/2016 | Minowa et al. | H01L 27/14812 |
| 9,437,635 B2 | 9/2016 | Soda | H01L 27/14623 |
| 9,478,575 B2 | 10/2016 | Kato | H01L 27/14625 |
| 9,490,289 B2 | 11/2016 | Soda | H01L 27/14643 |
| 9,497,403 B2 | 11/2016 | Iwane et al. | H04N 3/155 |
| 9,538,112 B2 | 1/2017 | Wada et al. | H04N 5/378 |
| 9,681,078 B2 | 6/2017 | Tsuchiya et al. | H01L 27/1463 |
| 2005/0174552 A1 | 8/2005 | Takada et al. | 355/53 |
| 2007/0205439 A1 | 9/2007 | Okita et al. | 257/228 |
| 2009/0050993 A1* | 2/2009 | Yamazaki | H01L 27/14603 257/432 |
| 2009/0201406 A1 | 8/2009 | Okita et al. | 348/308 |
| 2010/0006969 A1* | 1/2010 | Park | H01L 27/14621 257/446 |
| 2012/0009720 A1* | 1/2012 | Shim | H01L 27/14625 438/70 |
| 2012/0181590 A1 | 7/2012 | Okita et al. | 257/292 |
| 2013/0113966 A1 | 5/2013 | Arishima et al. | 348/301 |
| 2013/0181118 A1 | 7/2013 | Koizumi et al. | 250/208.1 |
| 2013/0194468 A1 | 8/2013 | Okita | 348/294 |
| 2013/0222552 A1* | 8/2013 | Agranov | H04N 13/286 348/49 |
| 2014/0002684 A1 | 1/2014 | Okita et al. | 348/220.1 |
| 2014/0035086 A1 | 2/2014 | Kato | 257/432 |
| 2014/0299746 A1* | 10/2014 | Iwata | H01L 27/1463 250/208.1 |
| 2014/0307151 A1 | 10/2014 | Soda | 348/350 |
| 2014/0340555 A1 | 11/2014 | Iwane et al. | 348/308 |
| 2015/0062367 A1 | 3/2015 | Inui | 348/222.1 |
| 2016/0057372 A1 | 2/2016 | Iwane et al. | H01L 27/14609 |
| 2016/0071896 A1 | 3/2016 | Kawabata et al. | H01L 27/14621 |
| 2016/0071902 A1 | 3/2016 | Okita et al. | H01L 27/14625 |
| 2016/0133663 A1 | 5/2016 | Minowa et al. | H01L 27/1464 |
| 2016/0218127 A1 | 7/2016 | Kato et al. | H01L 27/14643 |
| 2016/0360126 A1 | 12/2016 | Soda et al. | H01L 27/14641 |
| 2017/0047363 A1* | 2/2017 | Choi | H01L 27/1463 |
| 2017/0092677 A1 | 3/2017 | Ikakura et al. | H01L 27/14685 |
| 2017/0208277 A1* | 7/2017 | Borthakur | H04N 5/378 |
| 2017/0301718 A1* | 10/2017 | Chou | G03B 13/36 |

* cited by examiner

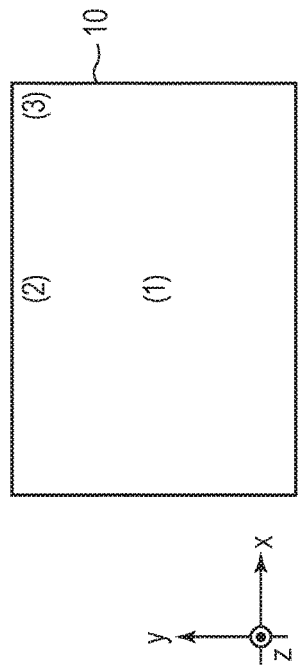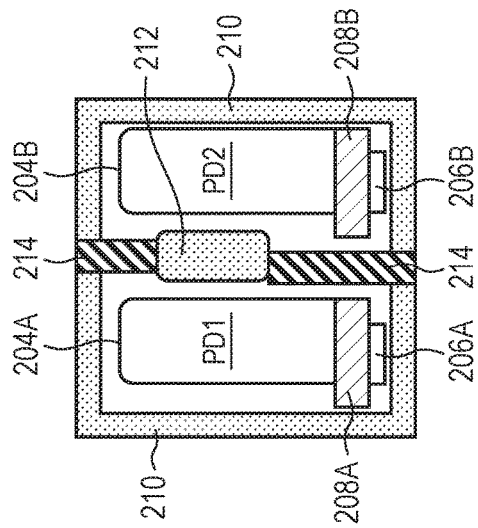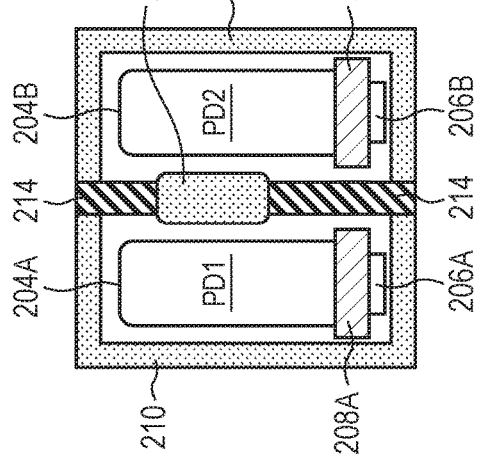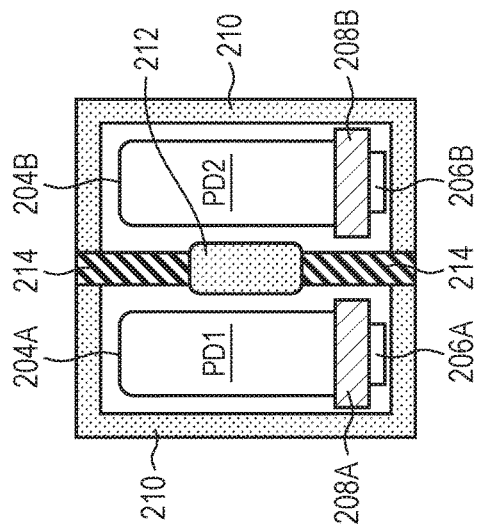

IMAGING DEVICE

BACKGROUND OF THE INVENTION

Field of the Invention

The present invention relates to an imaging device including pixels provided with a plurality of photoelectric conversion units.

Description of the Related Art

An auto focus (AF) function of automatically adjusting the focus during imaging is widely used in an imaging system, such as a video camera and an electronic still camera. In a well-known imaging device with the AF function, each pixel includes a plurality of photoelectric conversion units. In an imaging device in which one pixel includes two photoelectric conversion units, a pair of output signals from the two photoelectric conversion units of one pixel can be used to perform focus detection based on a phase difference detection method, and the output signals from the two photoelectric conversion units can be added to acquire an image signal.

A photoelectric conversion device is described in Japanese Patent Application Laid-Open No. 2013-084742, wherein an isolation structure between photoelectric conversion units is devised to obtain an appropriate signal even if a plurality of photoelectric conversion units has different sensitivities or amounts of incident light when signals of the plurality of photoelectric conversion units is handled as one signal.

Improvement in the focus detection accuracy, acquisition of an appropriate signal even if a plurality of photoelectric conversion units has different sensitivities or amounts of incident light, and increase in saturation charge amount of the photoelectric conversion units are desired when pixels including a plurality of photoelectric conversion units are used to take an image and detect the focus.

However, they are in a trade-off relationship, and for example, the focus detection accuracy and the saturation charge amount of the photoelectric conversion units are reduced in some cases when the technique described in Japanese Patent Application Laid-Open No. 2013-084742 is used to obtain an appropriate signal even if the plurality of photoelectric conversion units has different sensitivities or amounts of incident light. The effect is particularly noticeable in an imaging device with the pixel size of several microns or less or in a backside illuminated imaging device.

SUMMARY OF THE INVENTION

An object of the present invention is to provide an imaging device including pixels provided with a plurality of photoelectric conversion units, the imaging device capable of realizing acquisition of an appropriate image according to an amount of received light and improvement of focus detection accuracy.

According to one aspect of the present invention, there is provided an imaging device including a plurality of pixels two-dimensionally disposed, at least part of the plurality of pixels including a first photoelectric conversion unit and a second photoelectric conversion unit provided in a semiconductor substrate and each including a first semiconductor region of a first conductivity type for accumulating a signal charge generated by photoelectric conversion, a first isolation region provided in the semiconductor substrate between the first photoelectric conversion unit and the second photoelectric conversion unit and including a second semiconductor region forming a first potential barrier for the signal charge in the first semiconductor region, and a second isolation region provided in the semiconductor substrate between the first photoelectric conversion unit and the second photoelectric conversion unit and including a trench isolation forming a second potential barrier higher than the first potential barrier for the signal charge in the first semiconductor region.

Further features of the present invention will become apparent from the following description of exemplary embodiments with reference to the attached drawings.

BRIEF DESCRIPTION OF THE DRAWINGS

FIGS. 10A, 10B, 10C and 10D are diagrams illustrating an example of configuration of the pixel of an imaging device according to a fifth embodiment of the present invention.

DESCRIPTION OF THE EMBODIMENTS

Embodiments of an imaging device according to the present invention will now be described with reference to the drawings. Note that well-known or publicly-known techniques in the technical field can be applied to parts not particularly illustrated or described in the present specification. Each embodiment described below is one embodiment of the present invention, and the embodiment is not limited to this.

First Embodiment

Figure 1:
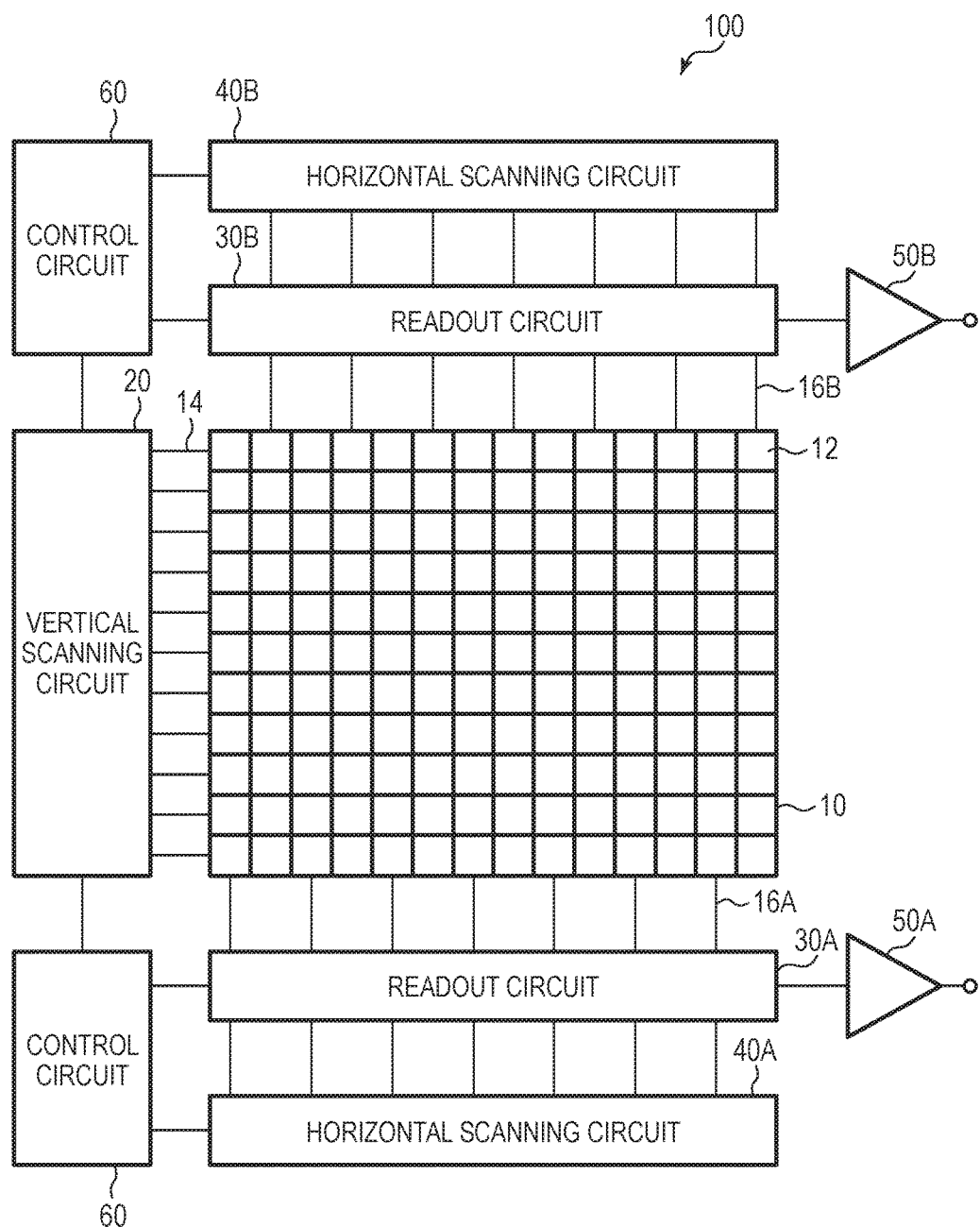
FIG. 1 is a block diagram illustrating a schematic configuration of an imaging device according to a first embodiment of the present invention.
Figure 2:
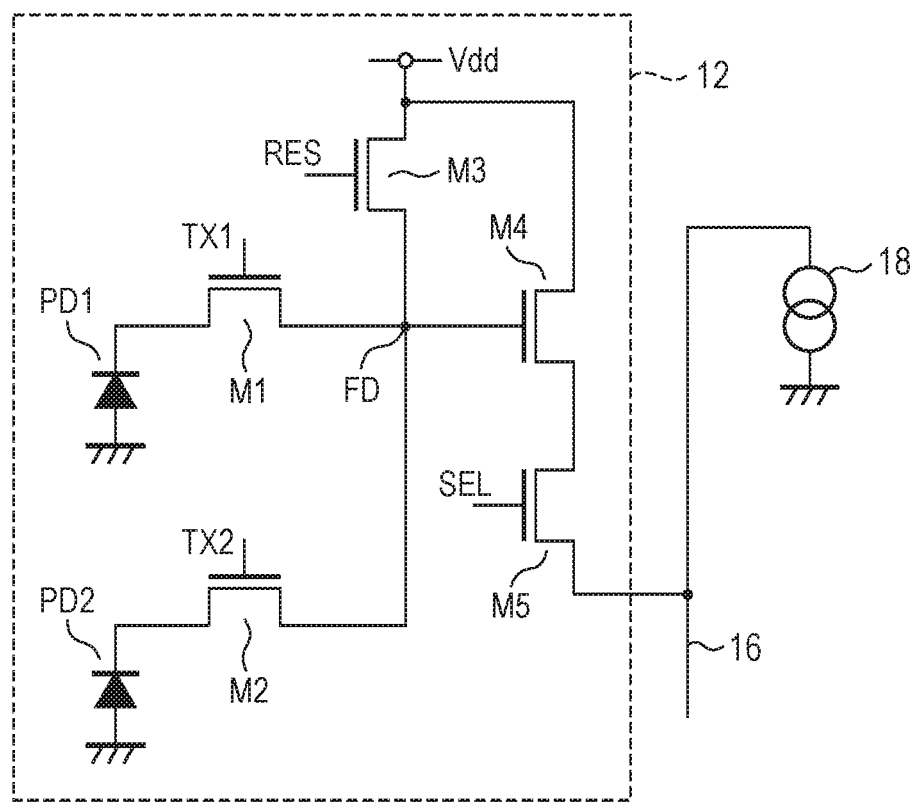
FIG. 2 is a diagram illustrating an example of a pixel circuit of the imaging device according to the first embodiment of the present invention.
Figure 4:
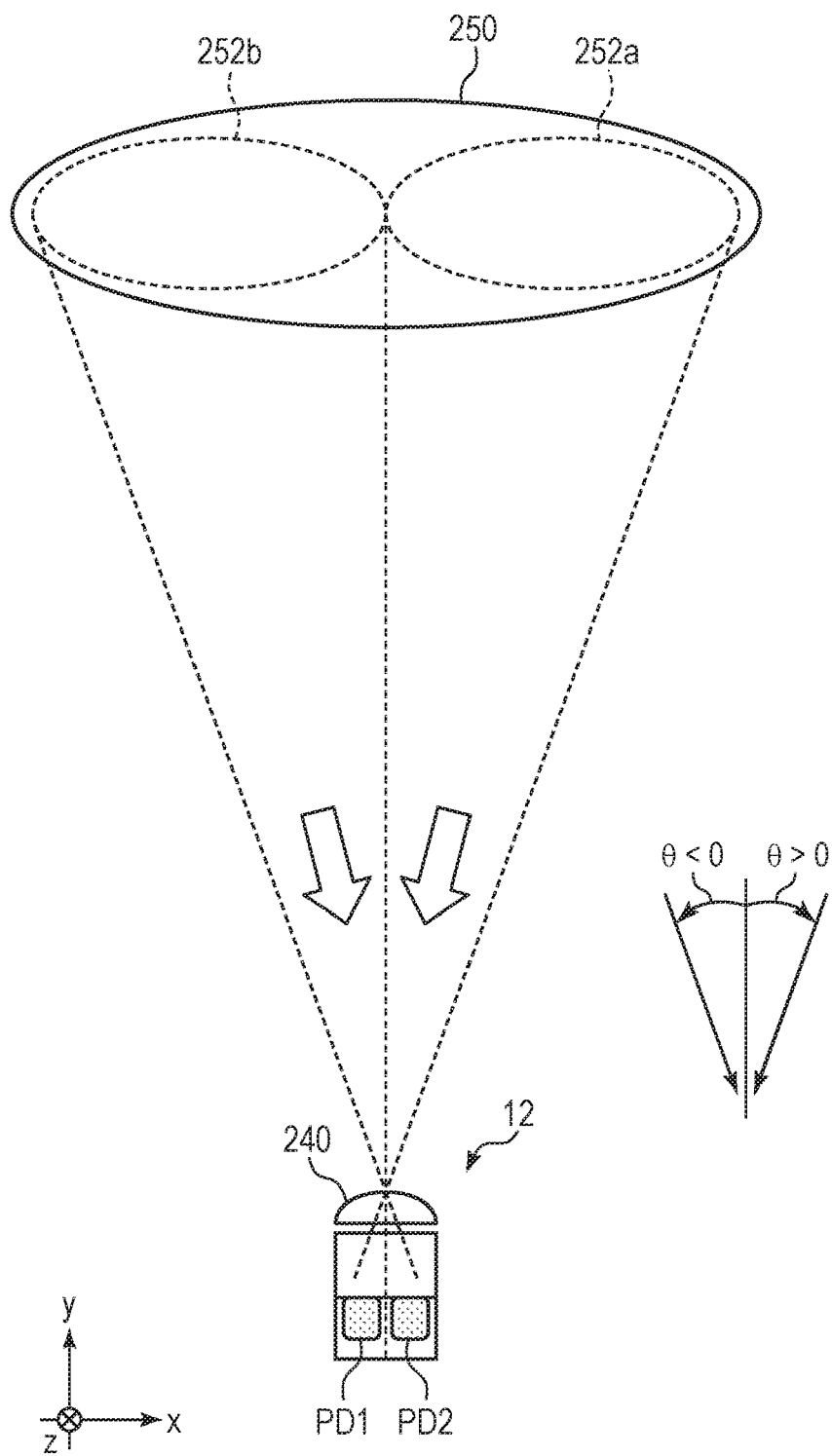
FIG. 4 is a diagram describing a relationship between an exit pupil of an imaging optical system and light entering the pixel.
Figure 5A:
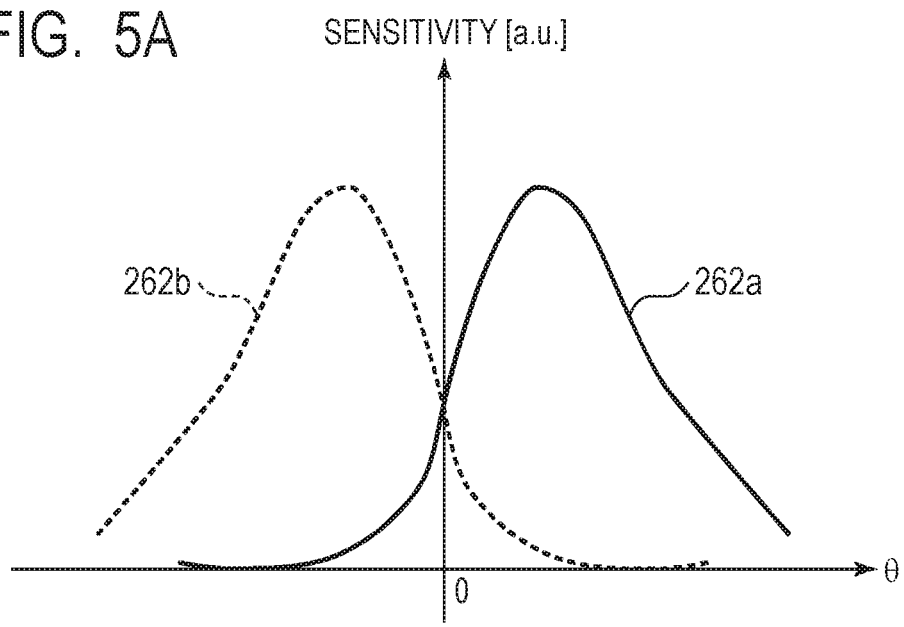
FIGS. 5A and 5B are graphs illustrating incident angle characteristics of sensitivity of photoelectric conversion units for the light incident on the pixel.
Figure 5B:
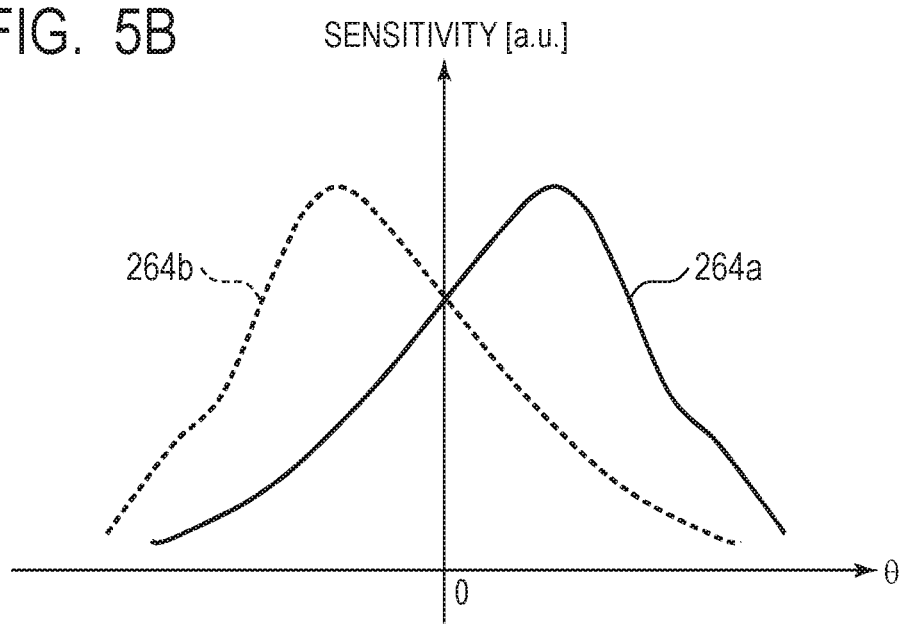
Figure 6A:
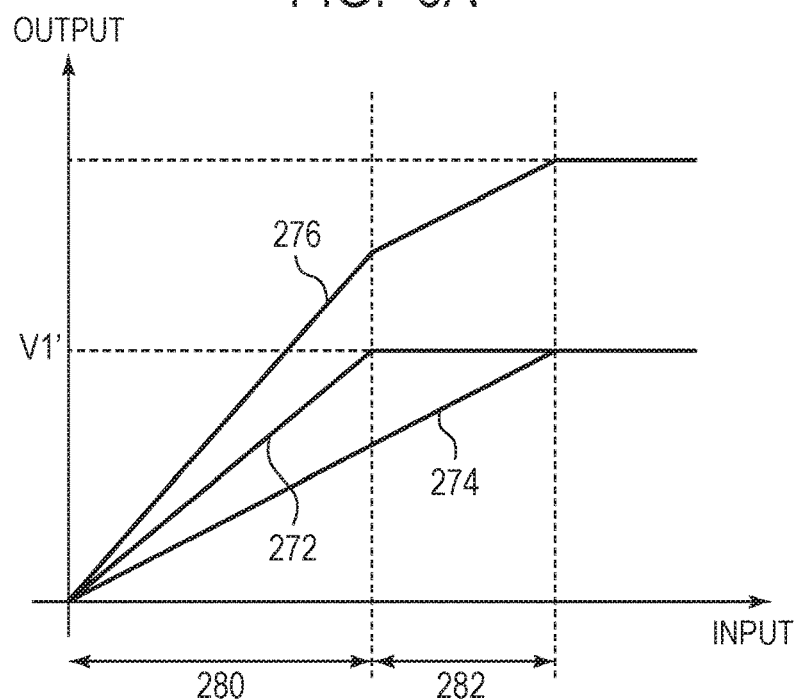
FIGS. 6A and 6B are graphs illustrating a relationship between the amount of light incident on the pixel and output from the photoelectric conversion units.
Figure 6B:
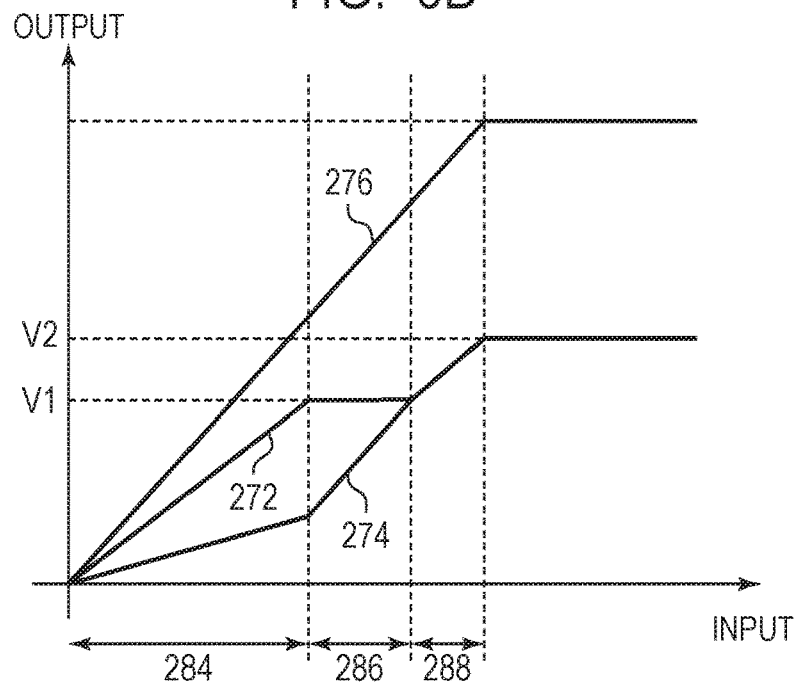

An imaging device according to a first embodiment of the present invention will be described with reference to FIGS. 1 to 6B. FIG. 1 is a block diagram illustrating an example of configuration of the imaging device according to the present embodiment. FIG. 2 is a diagram illustrating an example of a pixel circuit of the imaging device according to the present embodiment. FIGS. 3A to 3D are diagrams illustrating an example of configuration of a pixel of the imaging device according to the present embodiment. FIG. 4 is a diagram describing a relationship between an exit pupil of an imaging optical system and light incident on the pixel. FIGS. 5A and 5B are graphs illustrating incident angle characteristics of sensitivity of photoelectric conversion units with respect to the light incident on the pixel. FIGS. 6A and 6B are graphs illustrating relationships between an amount of light incident on the pixel and output from the photoelectric conversion units.

As illustrated in FIG. 1, an imaging device 100 according to the present embodiment includes a pixel region 10, a vertical scanning circuit 20, readout circuits 30A and 30B, horizontal scanning circuits 40A and 40B, output amplifiers 50A and 50B and control circuits 60.

A plurality of pixels 12 is two-dimensionally (in a matrix) disposed throughout a plurality of rows and a plurality of columns in the pixel region 10. The plurality of pixels 12 includes imaging pixels and focus detection pixels. The imaging pixels are pixels that output image signals for forming an image. The focus detection pixels are pixels that output focus detection signals for focus detection using a phase difference detection method. The focus detection pixels may be dispersed and disposed in the pixel region 10 or may be one-dimensionally or two-dimensionally arranged and disposed. The focus detection pixels may be used only for the focus detection or may be used not only for the focus detection, but also for generating an image, that is, as imaging pixels.

The vertical scanning circuit 20 is a circuit unit that supplies, to the pixels 12, control signals for driving readout circuits in the pixels 12 to read out signals from the pixels 12, through control signal lines 14 provided for each row of the pixel array. The signals read out from the pixels 12 are input to the readout circuits 30 through vertical output lines 16 provided for each column of the pixel array. FIG. 1 illustrates an example in which the readout circuits 30A and 30B are provided on a circumference facing the pixel region 10, and the columns are divided into columns connected to the readout circuit 30A through vertical output lines 16A and columns connected to the readout circuit 30B through vertical output lines 16B. One readout circuit 30 connected to all columns may be provided, instead of a plurality of readout circuits 30.

The readout circuits 30A and 30B are circuit units that apply predetermined processing, such as signal processing like amplification processing and addition processing, to the signals read out from the pixels 12. The readout circuits 30A and 30B can include, for example, column amplifiers, correlated double sampling (CDS) circuits and adding circuits. The readout circuits 30A and 30B may further include A/D conversion circuits.

The horizontal scanning circuits 40A and 40B are circuit units that supply, to the readout circuits 30A and 30B, control signals for sequentially transferring the signals of the columns processed by the readout circuits 30A and 30B to the output amplifiers 50A and 50B. The output amplifiers 50A and 50B are circuit units including buffer amplifiers and differential amplifiers and configured to amplify and output the signals of columns selected by the horizontal scanning circuits 40A and 40B.

The control circuits 60 are circuit units that supply control signals for controlling operation and timing to the vertical scanning circuit 20, the readout circuits 30A and 30B and the horizontal scanning circuits 40A and 40B. The control circuits 60 may not be provided on the imaging device 100, and the control signals supplied to the vertical scanning circuit 20, the readout circuits 30A and 30B and the horizontal scanning circuits 40A and 40B may be supplied from the outside of the imaging device 100.

In the present specification, a region other than the pixel region 10, that is, a region provided with the vertical scanning circuit 20, the readout circuits 30A and 30B, the horizontal scanning circuits 40A and 40B, the output amplifiers 50A and 50B and the control circuits 60, may be called a peripheral circuit region.

The configuration is just an example of configuration of the imaging device 100 in which the present invention can be applied, and the configuration of the imaging device in which the present invention can be applied is not limited to this.

As illustrated for example in FIG. 2, the pixel 12 includes photoelectric conversion units PD1 and PD2, transfer transistors M1 and M2, a reset transistor M3, an amplifier transistor M4 and a select transistor M5. The photoelectric conversion units PD1 and PD2 are, for example, photodiodes. An anode of the photodiode of the photoelectric conversion unit PD1 is connected to a ground voltage line, and a cathode is connected to a source of the transfer transistor M1. An anode of the photodiode of the photoelectric conversion unit PD2 is connected to a ground voltage line, and a cathode is connected to a source of the transfer transistor M2. Drains of the transfer transistors M1 and M2 are connected to a source of the reset transistor M3 and a gate of the amplifier transistor M4. Connection nodes of the sources of the transfer transistors M1 and M2, the source of the reset transistor M3 and the gate of the amplifier transistor M4 form a so-called floating diffusion (FD) region. A drain of the reset transistor M3 and a drain of the amplifier transistor M4 are connected to a power supply voltage line (Vdd). A source of the amplifier transistor M4 is connected to a drain of the select transistor M5. A source of the select transistor M5 is connected to the vertical output line 16. A current source 18 for supplying a bias current to the amplifier transistor M4 to form a source follower circuit is connected to the other end of the vertical output line 16.

The photoelectric conversion units PD1 and PD2 generate charge according to amounts of incident light through photoelectric conversion. The transfer transistor M1 transfers the charge generated by the photoelectric conversion unit PD1 to the FD region. The transfer transistor M2 transfers the charge generated by the photoelectric conversion unit PD2 to the FD region. The FD region functions as a charge holding unit that holds the charge transferred from the photoelectric conversion units PD1 and PD2 by a capacitor parasitically coupled to a node of the FD region and also functions as a charge voltage conversion unit that converts an amount of held charge to a voltage applied to the gate of the amplifier transistor M4. The reset transistor M3 has a function of resetting the potential of the FD region and the photoelectric conversion units PD1 and PD2. The amplifier transistor M4 outputs a pixel signal according to a gate voltage to the vertical output line 16 through the select transistor M5. The reset transistor M3, the amplifier transistor M4 and the select transistor M5 are transistors that form the readout circuit in the pixel configured to output a pixel signal based on the amount of charge held in the FD region that is a charge holding unit.

When the focus detection signal is output from the pixel 12, a signal based on the signal charge generated by the photoelectric conversion unit PD1 and a signal based on the signal charge generated by the photoelectric conversion unit PD2 are output. An external signal processing unit calculates a defocus amount based on the signal based on the signal charge generated by the photoelectric conversion unit PD1 and the signal based on the signal charge generated by the photoelectric conversion unit PD2. When the image signal is output from the pixel 12, the signal charge generated by the photoelectric conversion unit PD1 and the signal charge generated by the photoelectric conversion unit PD2 are added in the FD region, and a signal based on the total signal charge is output.

In the circuit configuration illustrated in FIG. 2, the control signal line 14 of each row includes transfer gate signal lines TX1 and TX2, a reset signal line RES and a select signal line SEL. The transfer gate signal line TX1 of each row is connected to gates of the transfer transistors M1 of a plurality of pixels 12 belonging to the row. The transfer gate signal line TX2 of each row is connected to gates of the transfer transistors M2 of a plurality of pixels 12 belonging to the row. The reset signal line RES of each row is connected to gates of the reset transistors M3 of a plurality of pixels 12 belonging to the row. The select signal line SEL of each row is connected to gates of the select transistors M5 of a plurality of pixels 12 belonging to the row.

Note that the image pixels may have a pixel configuration similar to the focus detection pixels or may have a pixel configuration different from the focus detection pixels. When the imaging pixels have a pixel configuration similar to the focus detection pixels, the pixel signal is generated based on the total charge generated by the two photoelectric conversion units PD1 and PD2. The number of photoelectric conversion units included in one pixel 12 may not be two, but may be three or more. In the imaging pixels, the number of photoelectric conversion units included in one pixel 12 may be one.

Figure 3A:
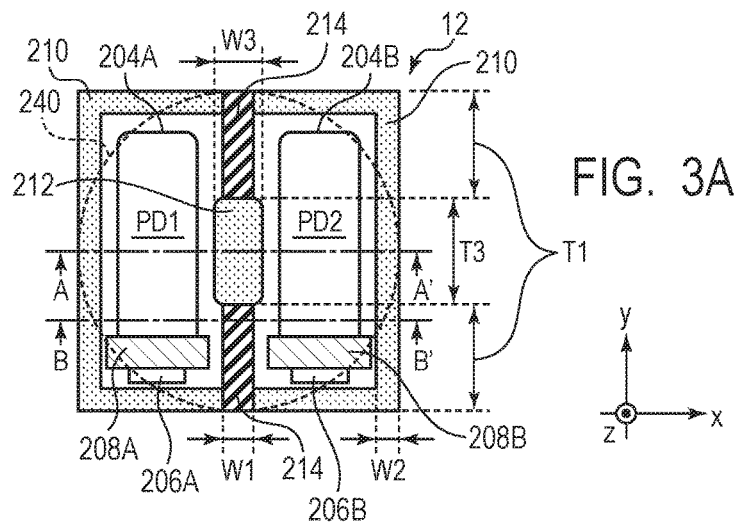
FIGS. 3A, 3B, 3C, 3D and 3E are diagrams illustrating an example of configuration of a pixel of the imaging device according to the first embodiment of the present invention.
Figures 3B, 3C:
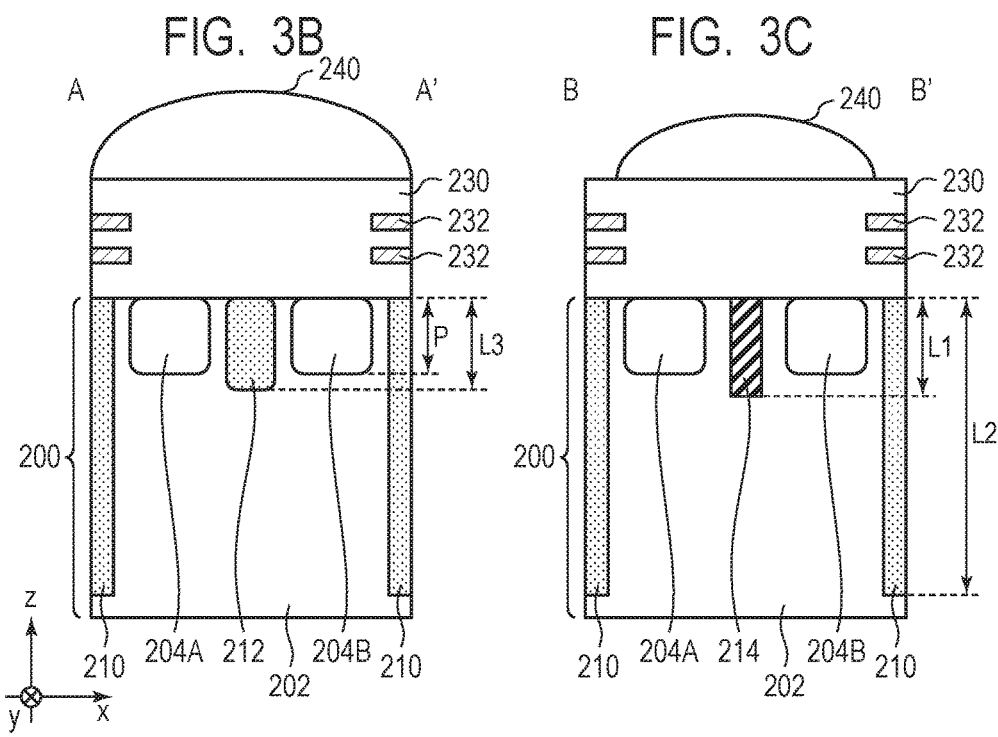

FIGS. 3A to 3C are diagrams illustrating a structure of a part provided with the photoelectric conversion units PD1 and PD2 and the transfer transistors M1 and M2 of the pixel 12. Although each pixel 12 further includes the reset transistor M3, the amplifier transistor M4 and the select transistor M5, the transistors will not be described here. FIG. 3A is a plan view of the photoelectric conversion units PD1 and PD2 as viewed from a light incident direction. FIG. 3B is a cross-sectional view along a line A-A' of FIG. 3A. FIG. 3C is a cross-sectional view along a line B-B' of FIG. 3A.

Note that the pixel 12 represents the focus detection pixel in the following description. However, the imaging pixel can have a configuration similar to the focus detection pixel. The pixel configuration of the imaging device of the present embodiment can obtain combined output without a knee characteristic and can obtain a large saturation charge amount as described later, and the pixel configuration is also useful for the imaging pixel.

A p-type semiconductor region 202 is provided in at least a main surface side of a semiconductor substrate 200. The semiconductor substrate 200 is, for example, an n-type silicon substrate, and the p-type semiconductor region 202 is, for example, a p-well. For the convenience of the description, a vertical coordinate system is defined here, wherein the surface of the semiconductor substrate 200 is an x-y plane, and a normal direction of the semiconductor substrate 200 is a z direction. A direction of the light incident on the pixel 12 is substantially a −z direction. An x direction corresponds to a pupil division direction of the focus detection pixel.

The photoelectric conversion unit PD1 includes an n-type semiconductor region 204A provided in a surface portion of the p-type semiconductor region 202. The n-type semiconductor region 204A forms a p-n junction with the p-type semiconductor region 202 and forms a photodiode that is the photoelectric conversion unit PD1. The n-type semiconductor region 240A has a low potential for electrons and functions as a charge accumulation unit for accumulating electrons that are signal charge. Here, P represents a depth of the n-type semiconductor region 204A in the z direction.

Similarly, the photoelectric conversion unit PD2 includes an n-type semiconductor region 204B provided apart from the n-type semiconductor region 204A, in the surface portion of the p-type semiconductor region 202. The n-type semiconductor regions 204A and 204B are arranged adjacent to each other in the x direction. The n-type semiconductor region 204B forms a p-n junction with the p-type semiconductor region 202 and forms a photodiode that is the photoelectric conversion unit PD2. The n-type semiconductor region 204B has a low potential for electrons and functions as a charge accumulation unit for accumulating electrons that are signal charge. Here, P represents a depth of the n-type semiconductor region 204B in the z direction.

In this way, the photoelectric conversion unit PD1 and the photoelectric conversion unit PD2 are arranged adjacent to each other in the x direction in plan view. In the present specification, an expression "in plan view" will be used to describe a positional relationship between the components projected on a plane parallel to the surface of the semiconductor substrate 200. An example of a layout in plan view is a plan view of the semiconductor substrate 200 as viewed from the light incident direction.

The photoelectric conversion units PD1 and PD2 may be so-called buried photodiodes. In this case, p-type semiconductor regions of a conductivity type opposite the n-type semiconductor regions 204A and 204B are provided in the surface portions of the n-type semiconductor regions 204A and 204B.

An n-type semiconductor region 206A is also provided in the surface portion of the p-type semiconductor region 202, apart from the n-type semiconductor region 204A. The n-type semiconductor regions 204A and 206A are arranged adjacent to each other in the y direction. A gate electrode 208A is provided over the semiconductor substrate 200 between the n-type semiconductor region 204A and the n-type semiconductor region 206A with a gate insulating film (not illustrated) interposed therebetween. This forms the transfer transistor M1 including the n-type semiconductor region 204A as a source, the n-type semiconductor region 206A as a drain, and the gate electrode 208A as a gate. The n-type semiconductor region 206A is also an FD region.

Similarly, an n-type semiconductor region 206B is provided in the surface portion of the p-type semiconductor region 202, apart from the n-type semiconductor region 204B. The n-type semiconductor regions 204B and 206B are arranged adjacent to each other in the y direction. A gate electrode 208B is provided over the semiconductor substrate 200 between the n-type semiconductor region 204B and the n-type semiconductor region 206B with a gate insulating film (not illustrated) interposed therebetween. This forms the transfer transistor M2 including the n-type semiconductor region 204B as a source, the n-type semiconductor region 206B as a drain, and the gate electrode 208B as a gate. The n-type semiconductor region 206B is also an FD region.

An isolation region 210 is provided around the region provided with the photoelectric conversion units PD1 and PD2 and the transfer transistors M1 and M2 so as to surround the regions. The isolation region 210 is configured to isolate the photoelectric conversion units PD1 and PD2 from other adjacent pixels 12. The isolation region 210 includes a p-type semiconductor region with a carrier concentration higher than the p-type semiconductor region 202. At least part of the isolation region 210 may be an element isolation insulating region formed by, e.g., STI (Shallow Trench Isolation) method or LOCOS (LOCal Oxidation of Silicon) method. Here, L2 represents a depth of the isolation region 210 in the z direction.

Isolation regions 212 and 214 are provided in a region between the region provided with the photoelectric conversion unit PD1 and the transfer transistor M1 and the region provided with the photoelectric conversion unit PD2 and the transfer transistor M2 in the region surrounded by the isolation region 210. The isolation region 212 and the isolation regions 214 are arranged adjacent to each other in a direction (y direction) intersecting the x direction in a plan view. In the example of FIG. 3A, one isolation region 212 and two isolation regions 214 are provided, and the two isolation regions 214 are arranged across the isolation region 212 in the y direction in the plan view. Therefore, there are a part provided with the isolation region 212 and not provided with the isolation regions 214 and a part provided with the isolation regions 214 and not provided with the isolation region 212 in the region between the region provided with the photoelectric conversion unit PD1 and the region provided with the photoelectric conversion unit PD2. Although FIG. 3A illustrates a state in which the isolation region 212 and the isolation regions 214 are in contact with each other, the isolation region 212 and the isolation regions 214 may be apart from each other. The isolation regions 210, 212 and 214 are provided throughout a predetermined depth from the surface of the semiconductor substrate 200. Here, L3 and L1 represent depths of the isolation regions 212 and 214 in the z direction, respectively.

The isolation regions 212 and 214 are configured to isolate the photoelectric conversion unit PD1 and the photoelectric conversion unit PD2. The isolation region 212 includes a semiconductor region that can form a potential barrier for the signal charge between the n-type semiconductor region 204A and the n-type semiconductor region 204B. The isolation region 212 typically includes a semiconductor region (p-type semiconductor region) of a conductivity type opposite the charge accumulation units (n-type semiconductor regions 204A and 204B) of the photoelectric conversion units PD1 and PD2 and forms a p-n junction isolation between the n-type semiconductor region 204A and the n-type semiconductor region 204B. The isolation region 212 can be a semiconductor region that can form a potential barrier between the n-type semiconductor region 204A and the n-type semiconductor region 204B and may be formed by an n-type semiconductor region with a carrier concentration lower than the n-type semiconductor regions 204A and 204B. The isolation regions 214 are formed by isolation structures, or so-called trench isolations, formed by filling a filler into trenches provided in the semiconductor substrate 200. Note that the isolation region 212 can be considered as a part of a gap not provided with the isolation regions 214 between the photoelectric conversion unit PD1 and the photoelectric conversion unit PD2. Dopant impurities may not be separately introduced into the isolation region 212.

An insulating layer 230 is provided over the semiconductor substrate 200. The insulating layer 230 may be a single layer film formed by one type of material or may be a laminated film including a plurality of films made of different materials. Examples of the material of the insulating layer 230 include, but not particularly limited to, silicon oxide ($SiO_2$), silicon nitride ($Si_3N_4$) and silicon carbide (SiC). For example, the insulating layer 230 may be a single layer film made of silicon oxide or may be a laminated film made of silicon oxide, silicon nitride and silicon carbide. The insulating layer 230 includes interconnection layers 232 forming interconnection lines or signal lines of the components. The interconnection layers 232 may be one layer or may be a multi-level structure with two or more layers. FIGS. 3B and 3C illustrate an example in which the interconnection layers have a two-layer structure.

A microlens 240 is provided over the insulating layer 230. One microlens 240 is provided for one pixel 12 including the two photoelectric conversion units PD1 and PD2, and the microlens 240 condenses the incident light on the photoelectric conversion units PD1 and PD2. A color filter (not illustrated) may be provided between the microlens 240 and the semiconductor substrate 200.

Note that the configuration is an example in which electrons are used as signal charge. The conductivity type of each semiconductor region is opposite when holes are used as signal charge. The naming of the sources and the drains of the transistors in the description is an example, and all or part of the sources and the drains may be called by opposite names depending on the conductivity type of the transistors or the target function. The same applies to the other embodiments.

Figures 3D, 3E:
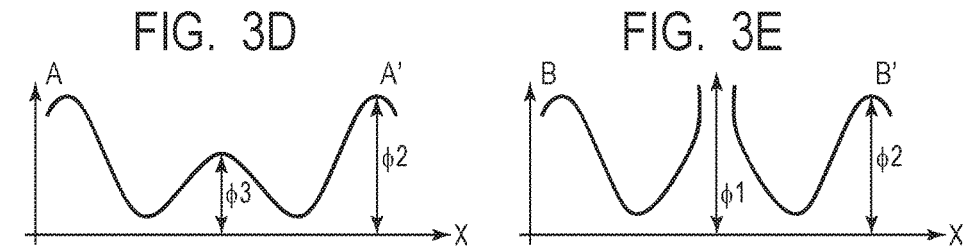

FIG. 3D is a potential distribution diagram depicted by connecting the minimum height of the potential barrier in the region between the surface of the semiconductor substrate 200 and the depth L1 along the cross-section of the line A-A'. FIG. 3E is a potential distribution diagram depicted by connecting the minimum height of the potential barrier in the region between the surface of the semiconductor substrate 200 and the depth L1 along the cross-section of the line B-B'.

When the heights of the potential barrier for the signal charge (electrons here) of the isolation regions 214, 210 and 212 are defined as $\phi1$, $\phi2$ and $\phi3$, respectively, the heights $\phi1$, $\phi2$ and $\phi3$ of the potential barrier are in the following relationship.

$$\phi3 < \phi2 \leq \phi1$$

The height $\phi1$ of the potential barrier is a height of the potential barrier for the signal charge formed by the isolation regions 214 between the n-type semiconductor region 204A and the n-type semiconductor region 204B. The height $\phi2$ of the potential barrier is a height of the potential barrier for the signal charge formed by the isolation region 210 between the adjacent pixel and the n-type semiconductor regions 204A and 204B. The height $\phi3$ of the potential barrier is a height of the potential barrier for the signal charge formed by the isolation region 212 between the n-type semiconductor region 204A and the n-type semiconductor region 204B.

It is desirable that lengths T1 and T3 and widths W1, W2 and W3 are in the following relationship, wherein T1 represents a total length of the length of the isolation regions 214 in the y direction, W1 represents a width in the x direction, T3 represents a length of the isolation region 212 in the y direction, W3 represents a width in the x direction, and W2 represents a width of the isolation region 210 in the x direction.

$$T3 \leq T1, W3 > W1, W3 > W2$$

In the present specification, the lengths of the isolation regions 212 and 214 are lengths of the isolation regions 212 and 214 in the direction (y direction) intersecting the direction (x direction) in which the photoelectric conversion units PD1 and PD2 are arranged adjacent to each other. The widths of the isolation regions 212 and 214 are lengths of the isolation regions 212 and 214 in the direction (x direction) in which the photoelectric conversion units PD1 and PD2 are arranged adjacent to each other.

It is desirable that depths P, L1, L2 and L3 are in the following relationship, wherein P represents a depth of the n-type semiconductor regions 204A and 204B in the z direction, L1 represents a depth of the isolation regions 214 in the z direction, L2 represents a depth of the isolation regions 210 in the z direction, and L3 represents a depth of the isolation region 212 in the z direction.

$$P < L3 < L2, P < L1 < L2$$

Next, a principle of focus detection using the focus detection pixels will be simply described as a prerequisite technique, before describing the reason for setting the parameters as described above and specific advantageous effects obtained from the parameters in the imaging device according to the present embodiment. Note that when an incident angle θ of the light on the pixel 12 is described below, the incident angle θ of the light entering from the optical axis of the imaging optical system, that is, the direction (−z direction) parallel to the z axis, is 0 degrees. The sign of the incident angle θ of the light entering from a direction inclined from the z axis toward the first quadrant of the x-z plane is positive (θ>0), and the sign of the incident angle θ of the light entering from a direction inclined from the z axis toward the second quadrant of the x-z plane is negative (θ<0) (see FIG. 4).

The light passing through an exit pupil 250 of the imaging optical system enters the photoelectric conversion units PD1 and PD2 of the same pixel 12 through the microlens 240 as illustrated in FIG. 4. Here, it is assumed that there are a pupil region 252a and a pupil region 252b adjacent to each other in the x direction in the exit pupil 250. The light entering the pixel 12 from the pupil region 252a (that is, light with incident angle θ>0) of the light passing through the exit pupil 250 transmits through the microlens 240 and enters the photoelectric conversion unit PD1. On the other hand, the light entering the pixel 12 from the pupil region 252b (that is, light with incident angle θ<0) of the light passing through the exit pupil 250 transmits through the microlens 240 and enters the photoelectric conversion unit PD2. The photoelectric conversion units PD1 and PD2 generate signal charge according to the amounts of incident light through photoelectric conversion.

In the focus detection of the phase difference detection method, the positional relationship between the signal from the photoelectric conversion unit PD1 and the signal from the photoelectric conversion unit PD2 is relatively shifted to calculate an amount of correlation indicating a degree of coincidence of the signals, and an amount of image deviation is detected from an amount of shift with a good correlation (degree of coincidence of signals). The focus detection can be performed by converting the amount of image deviation to a defocus amount based on the relationship that the size of the amount of image deviation between the signal from the photoelectric conversion unit PD1 and the signal from the photoelectric conversion unit PD2 increases with an increase in the size of the defocus amount of the imaged signals.

In this way, the focus detection can be performed by measuring the phase difference between the signal output from the photoelectric conversion unit PD1 and the signal output from the photoelectric conversion unit PD2.

FIGS. 5A and 5B illustrate relationships (incident angle characteristics) between sensitivity of the photoelectric conversion units PD1 and PD2 and the incident angle of the incident light. FIG. 5A is an example of the incident angle characteristics of the pixel 12 with a good focus detection performance. For comparison, FIG. 5B illustrates the incident angle characteristics of the pixel 12 with a poor focus detection performance. A characteristic 262a of FIG. 5A and a characteristic 264a of FIG. 5B indicate the sensitivity of the photoelectric conversion unit PD1 for the incident light. A characteristic 262b of FIG. 5A and a characteristic 264b of FIG. 5B indicate the sensitivity of the photoelectric conversion unit PD2 for the incident light. The unit of the sensitivity is arbitrary.

When the potential barrier between the photoelectric conversion unit PD1 and the photoelectric conversion unit PD2 in the pixel 12 is sufficiently high, the charge generated by the photoelectric conversion unit PD1 and the charge generated by the photoelectric conversion unit PD2 are clearly isolated, and the incident angle characteristics are as illustrated in FIG. 5A. In this case, the signal based on the light entered from the pupil region 252a and the signal based on the light entered from the pupil region 252b in FIG. 4 are clearly isolated, and the focus detection performance is favorable.

However, when the potential barrier between the photoelectric conversion unit PD1 and the photoelectric conversion unit PD2 in the pixel 12 is low, leakage of charge, that is, crosstalk of charge, is high between the photoelectric conversion unit PD1 and the photoelectric conversion unit PD2. In this case, the incident angle characteristics are as illustrated in FIG. 5B, and the signal based on the charge generated by the photoelectric conversion unit PD1 and the signal based on the charge generated by the photoelectric conversion unit PD2 are not clearly isolated. As a result, the signal based on the light entered from the pupil region 252a and the signal based on the light entered from the pupil region 252b in FIG. 4 are not clearly isolated, and the focus detection performance is deteriorated.

Therefore, it is desirable that the potential barrier between the photoelectric conversion unit PD1 and the photoelectric conversion unit PD2 is as high as possible in order to improve the focus detection performance.

However, the following problem occurs if the potential barrier between the photoelectric conversion unit PD1 and the photoelectric conversion unit PD2 is too high.

FIGS. 6A and 6B are graphs illustrating relationships between the amount (input) of light incident on the pixel 12 and the output from the photoelectric conversion units PD1 and PD2. In FIGS. 6A and 6B, a characteristic 272 indicates the output from the photoelectric conversion unit PD1, a characteristic 274 indicates the output from the photoelectric conversion unit PD2, and a characteristic 276 indicates the output (combined output) obtained by combining the output of the photoelectric conversion unit PD1 and the output of the photoelectric conversion unit PD2. The combined output can be obtained by adding the output from the photoelectric conversion unit PD1 and the output from the photoelectric conversion unit PD2. Averaging, amplification or the like may be performed to obtain the combined output.

Note that FIGS. 6A and 6B illustrate a case in which the sensitivity of the photoelectric conversion unit PD1 is higher than the sensitivity of the photoelectric conversion unit PD2 or a case in which more light enters the photoelectric conversion unit PD1 than the photoelectric conversion unit PD2.

FIG. 6A illustrates the characteristics of a case in which the potential barrier between the photoelectric conversion unit PD1 and the photoelectric conversion unit PD2 is high. The case in which the potential barrier is high is a case in which the height of the potential barrier between the photoelectric conversion units PD1 and PD2 is higher than the height of the potential barrier formed with the adjacent pixel and higher than the height of the potential barrier formed with the FD region (n-type semiconductor regions 206A and 206B). More specifically, when the photoelectric conversion units PD1 and PD2 generate charge exceeding the saturation charge amount, the excessive charge does not move between the photoelectric conversion units PD1 and PD2, and the excessive charge flows out to the adjacent pixel or the FD region.

Output V1' is output corresponding to the saturation charge amount of the photoelectric conversion units PD1 and PD2. When the amount of light incident on the pixel 12 is in a range 280, the photoelectric conversion units PD1 and PD2 are not saturated, and both the output (characteristic 272) from the photoelectric conversion unit PD1 and the output (characteristic 274) from the photoelectric conversion unit PD2 increase with an increase in the amount of incident light. Appropriate output can be obtained from both the photoelectric conversion unit PD1 and the photoelectric conversion unit PD2 in the range 280, and appropriate output according to the amount of incident light can also be obtained for the combined output (characteristic 276).

When the amount of light incident on the pixel 12 is in a range 282, the photoelectric conversion unit PD2 is not saturated, but the photoelectric conversion unit PD1 is saturated. Therefore, the output (characteristic 274) from the photoelectric conversion unit PD2 increases with an increase in the amount of incident light, but the output from the photoelectric conversion unit PD1 is constant at the output V1'. More specifically, the charge generated by the photoelectric conversion unit PD1 beyond the saturation charge amount cannot go over the potential barrier between the photoelectric conversion unit PD1 and the photoelectric conversion unit PD2 to flow into the photoelectric conversion unit PD2, and the charge is leaked to the adjacent pixel or the like. As a result, the charge generated by the photoelectric conversion unit PD1 beyond the saturation charge amount is not reflected on the combined output of the output of the photoelectric conversion unit PD1 and the output of the photoelectric conversion unit PD2, and an inclination of the characteristic 276 in the range 282 is smaller than an inclination of the characteristic 276 in the range 280. As a result, the characteristic 276 has a so-called "knee characteristic" that is a characteristic in which the straight line is bent in the middle. If the characteristic 276 has a knee characteristic, the linearity of the output relative to the amount of incident light is deteriorated, and appropriate combined output according to the amount of incident light cannot be obtained.

Therefore, when the potential barrier between the photoelectric conversion unit PD1 and the photoelectric conversion unit PD2 is high, and the charge cannot move between the units, appropriate combined output according to the amount of incident light cannot be obtained if at least one of the photoelectric conversion unit PD1 and the photoelectric conversion unit PD2 is saturated.

FIG. 6B illustrates characteristics of a case in which the potential barrier between the photoelectric conversion unit PD1 and the photoelectric conversion unit PD2 is low. The case in which the potential barrier is low is a case in which the height of the potential barrier between the photoelectric conversion units PD1 and PD2 is lower than the height of the potential barrier formed with the adjacent pixel and lower than the height of the potential barrier formed with the FD region (n-type semiconductor regions 206A and 206B). More specifically, when one of the photoelectric conversion units PD1 and PD2 generates charge exceeding the saturation charge amount, the charge first flows into the other of the photoelectric conversion units PD1 and PD2.

Output V1 is output corresponding to the saturation charge amount of the photoelectric conversion units PD1 and PD2. When the amount of light incident on the pixel 12 is in a range 284, the photoelectric conversion units PD1 and PD2 are not saturated, and both the output (characteristic 272) from the photoelectric conversion unit PD1 and the output (characteristic 274) from the photoelectric conversion unit PD2 increase with an increase in the amount of incident light. Appropriate output can be obtained from both the photoelectric conversion unit PD1 and the photoelectric conversion unit PD2 in the range 284, and appropriate output according to the amount of incident light can also be obtained for the combined output (characteristics 276).

When the amount of light incident on the pixel 12 is in a range 286, the photoelectric conversion unit PD2 is not saturated, but the photoelectric conversion unit PD1 is saturated. In this case, the charge generated by the photoelectric conversion unit PD1 beyond the saturation charge amount can go over the potential barrier between the photoelectric conversion unit PD1 and the photoelectric conversion unit PD2 to move to the photoelectric conversion unit PD2. Therefore, when the amount of incident light of the pixel 12 is in the range 286, the combined output of the output of the photoelectric conversion unit PD1 and the output of the photoelectric conversion unit PD2 is based on the amount of charge obtained by combining the charge generated by the photoelectric conversion unit PD1 and the charge generated by the photoelectric conversion unit PD2. Therefore, appropriate combined output according to the amount of light can also be obtained in the range 286.

When the amount of incident light of the pixel 12 is in a range 288, both the photoelectric conversion units PD1 and PD2 are saturated, but the charge does not leak from the photoelectric conversion unit PD1 and the photoelectric conversion unit PD2 to the adjacent pixel and the like. Thus, there is no saturation in the photoelectric conversion units PD1 and PD2 as a whole. Therefore, when the amount of incident light of the pixel 12 is in the range 288, the combined output of the output of the photoelectric conversion unit PD1 and the output of the photoelectric conversion unit PD2 is based on the amount of charge obtained by combining the charge generated by the photoelectric conversion unit PD1 and the charge generated by the photoelectric conversion unit PD2.

Output V2 is output corresponding to the saturation charge amount of the photoelectric conversion units PD1 and PD2 as a whole. Appropriate combined output according to the amount of incident light can be obtained until the combined output reaches the output V2 that is output corresponding to the saturation charge amount of the photoelectric conversion units PD1 and PD2 as a whole.

Therefore, when the potential barrier between the photoelectric conversion unit PD1 and the photoelectric conversion unit PD2 is low, the combined output according to the amount of incident light can be obtained up to the amount of incident light corresponding to the saturation charge amount of the photoelectric conversion units PD1 and PD2 as a whole.

In this way, the height of the potential barrier between the photoelectric conversion unit PD1 and the photoelectric conversion unit PD2 can be appropriately set to obtain favorable combined output without a knee characteristic throughout a wide incident light amount range. However, when the photoelectric conversion unit PD1 and the photoelectric conversion unit PD2 are isolated only by the p-n junction isolation as described in Japanese Patent Application Laid-Open No. 2013-084742, it is difficult to realize all three of "favorable focus detection performance", "combined output without knee characteristic" and "sufficient saturation charge amount" at the same time. Particularly, the effect is noticeable when the pixel size is small at about several microns or when a backside illuminated sensor is used.

When the photoelectric conversion unit PD1 and the photoelectric conversion unit PD2 are isolated by the p-n junction isolation, the isolation region between the photoelectric conversion unit PD1 and the photoelectric conversion unit PD2 is formed by ion implantation of impurities in the semiconductor substrate 200. The impurities implanted in the semiconductor substrate 200 are distributed and spread by atomic scattering during the ion implantation or diffusion by subsequent thermal treatment, not only in the depth direction (−z direction), but also in the lateral directions (x and y directions). Therefore, the smaller the pixel size, the larger the proportion of the isolation region between the photoelectric conversion unit PD1 and the photoelectric conversion unit PD2 relative to the pixel size.

Although the height of the potential barrier is increased by increasing the carrier concentration of the region between the photoelectric conversion units PD1 and PD2 in the p-n junction isolation, the isolation region further spreads in the lateral directions. In addition, the volume of the photoelectric conversion units PD1 and PD2 is reduced, and the saturation charge amount is reduced. When the potential barrier between the photoelectric conversion unit PD1 and the photoelectric conversion unit PD2 is too high, desirable combined output according to the amount of incident light may not be obtained as described with reference to FIG. 6A.

Conversely, when the carrier concentration of the region between the photoelectric conversion unit PD1 and the photoelectric conversion unit PD2 is excessively reduced to narrow down the width between the photoelectric conversion units PD1 and PD2, the potential barrier becomes low, and the crosstalk of charge between the photoelectric conversion unit PD1 and the photoelectric conversion unit PD2 increases. As a result, the focus detection performance is deteriorated as described with reference to FIGS. 5A and 5B.

Thus, when the photoelectric conversion units PD1 and PD2 are isolated by the p-n junction isolation, it is difficult to realize all three of "favorable focus detection performance", "combined output without knee characteristic" and "sufficient saturation charge amount" at the same time, particularly when the pixel size is small at about several microns or less.

Therefore, the two photoelectric conversion units PD1 and PD2 of one pixel 12 that share one microlens 240 are isolated by two types of isolation regions 212 and 214 with different heights of potential barrier in the imaging device according to the present embodiment.

The isolation regions 214 are formed by so-called trench isolations. The isolation characteristics of the isolation regions 214 can be determined by the width and the depth of the trench, the type of the filler filling the trench and the like. The isolation regions 214 made of the trench isolations can be provided to significantly increase the height $\phi1$ of the potential barrier between the photoelectric conversion units PD1 and PD2 as illustrated in FIG. 3E, and the isolation regions 214 can almost completely block the movement of the charge. The width of the isolation regions 214 is determined by the width of the trenches formed on the semiconductor substrate 200, and the width can be reduced to about the minimum resolution dimension of the photolithography equipment used to manufacture the imaging device. Therefore, the isolation region 214 can be easily miniaturized according to the pixel size, as compared to the case of the p-n junction isolation.

The isolation region 212 is an isolation region made of a semiconductor region forming the potential barrier for the signal charge in the photoelectric conversion units PD1 and PD2, and the height $\phi3$ of the potential barrier is sufficiently smaller than the height $\phi1$ of the potential barrier of the isolation regions 214. As the isolation region 212 is provided in part of the region between the photoelectric conversion unit PD1 and the photoelectric conversion unit PD2, the charge can pass through the part of the isolation region 212 to move between the photoelectric conversion unit PD1 and the photoelectric conversion unit PD2, although the charge cannot go over the parts of the isolation regions 214. The height $\phi3$ of the potential barrier of the isolation region 212 can be designed by the width W3 of the isolation region 212 and the carrier concentration.

Therefore, the movement of the charge between the photoelectric conversion units PD1 and PD2, that is, the degree of the crosstalk of charge, can be controlled by providing the isolation region 212 and the isolation regions 214 between the photoelectric conversion units PD1 and PD2 and appropriately designing the parameters. This can obtain incident angle characteristics suitable for the focus detection as illustrated in FIG. 5A and can improve the focus detection performance. For example, the length T3 of the isolation region 212 can be equal to or smaller than the length T1 of the isolation region 214 (T3≤T1) to appropriately reduce the amount of charge moved between the photoelectric conversion unit PD1 and the photoelectric conversion unit PD2.

The isolation regions 214 can be miniaturized according to the pixel size as described above, and the reduction in the volume of the photoelectric conversion units PD1 and PD2 can be prevented compared to when the entire region between the photoelectric conversion units PD1 and PD2 is isolated by the p-n junction isolation. This can ensure a sufficient saturation charge amount of the photoelectric conversion units PD1 and PD2.

It is desirable that the height $\phi2$ of the potential barrier of the isolation region 210 surrounding the photoelectric conversion units PD1 and PD2 is greater than the height $\phi3$ of the potential barrier of the isolation region 212. This can prevent leakage of charge to the adjacent pixel or the FD region while allowing the movement of charge between the photoelectric conversion units PD1 and PD2. For example, when the photoelectric conversion unit PD1 is saturated earlier than the photoelectric conversion unit PD2, the charge can be moved to the photoelectric conversion unit PD2 before the charge is leaked to the adjacent pixel or the FD region, and this can obtain the output characteristics for the incident light as illustrated in FIG. 6B. The saturation charge amount of the photoelectric conversion units PD1 and PD2 as a whole can also be increased.

In summary, the height $\phi 1$ of the potential barrier of the isolation regions 214, the height $\phi 2$ of the potential barrier of the isolation region 210 and the height $\phi 3$ of the potential barrier of the isolation region 212 can be set to have the relationship of the following expression (1) as described above.

$$\phi 3 < \phi 2 \leq \phi 1 \qquad (1)$$

The configuration of the present embodiment can realize all three of "favorable focus detection performance", "combined output without knee characteristic" and "sufficient saturation charge amount" at the same time.

In the present embodiment, the isolation region 214, the isolation region 212 and the isolation region 214 are sequentially arranged in the y direction on the x-y plane, and the isolation region 212 is arranged around the center of the pixel 12. This is because the light entering from the microlens 240 is most concentrated on around the center of the pixel 12 on the x-y plane. The isolation region 212 can be arranged around the center of the pixel 12 to reduce the light lost in the isolation regions 214 and improve the sensitivity.

It is desirable that the width W1 of the isolation regions 214 is smaller than the width W3 of the isolation region 212 (W1<W3). The isolation regions 214 made of the trench isolations can be more easily miniaturized compared to the isolation region 212, and the width W1 of the isolation region 214 can be narrower than the width W3 of the isolation region 212. In this way, even when the pixel size is small, the volume of the photoelectric conversion units PD1 and PD2 can be large because the width W1 of the isolation regions 214 is narrowed down, and the saturation charge amount can be increased.

It is also desirable that the depth L1 of the isolation regions 214 and the depth L3 of the isolation region 212 are greater than the depth P of the n-type semiconductor regions 204A and 204B and smaller than the depth L2 of the isolation region 210 (P<L1<L2, P<L3<L2).

This can reduce the movement of the electrons accumulated in the n-type semiconductor regions 204A and 204B between the photoelectric conversion units PD1 and PD2 or between the pixel 12 and the adjacent pixel through the path of the semiconductor substrate 200 in the depth direction (−z direction). Therefore, the components of the crosstalk of charge among the electrons accumulated in the n-type semiconductor regions 204A and 204B can be further reduced, and the focus detection performance can be improved.

When the isolation region 210 and the isolation region 212 are formed by semiconductor regions (p-type semiconductor regions) of a conductivity type opposite the n-type semiconductor regions 204A and 204B, it is desirable that the carrier concentration of the isolation region 210 is equal to or greater than three times, or more preferably, equal to or greater than ten times, the carrier concentration of the isolation region 212. It is also desirable that the width W2 of the isolation region 210 is greater than the width W3 of the isolation region 212 (W3<W2).

In this way, the height $\phi 2$ of the potential barrier of the isolation region 210 can be greater than the height $\phi 3$ of the potential barrier of the isolation region 212 ($\phi 3 < \phi 2$).

At least part of the isolation region 210 may be a trench isolation similar to the isolation regions 214. As a result, the height $\phi 2$ of the potential barrier of the isolation region 210 and the height $\phi 3$ of the potential barrier of the isolation region 212 are substantially equal. The condition in this case has a relationship of the following expression (2) in expression (1). This can further reduce the crosstalk of charge between the pixel 12 and the adjacent pixel.

$$\phi 3 < \phi 2 = \phi 1 \qquad (2)$$

The filler filling the trenches of the isolation regions 214 is typically an insulating material. The trenches can be filled with the insulating material to significantly increase the height of the potential barrier of the isolation regions 214. Examples of the insulating material filling the trenches include, but not particularly limited to, silicon oxide, silicon nitride, silicon oxynitride and silicon carbide.

Another example of the insulating material filling the trenches includes a film with negative fixed charge, such as an insulating film at least partially crystallized. An example of the insulating film at least partially crystallized includes an insulating film that is an oxide of a metal, such as hafnium, zirconium, aluminum, tantalum, titanium, yttrium and lanthanoid, and that includes a region at least partially crystallized. Negative charge is formed in the films of the insulating materials through crystallization annealing at a predetermined temperature. Therefore, the surfaces of the semiconductor substrate and the isolation regions can be put into a hole accumulated state, and dark current components caused by an interface state can be reduced. This can reduce the effect of a defect generated on the trench surface and can reduce the generation of noise.

The filler filling the trenches of the isolation regions 214 can further be a material with a refractive index lower than the semiconductor substrate 200. The trenches of the isolation regions 214 can be filled with a material with a refractive index lower than the semiconductor substrate 200 to actively increase the reflection in the interface between the semiconductor substrate 200 and the isolation regions 214. This can reduce not only the crosstalk of charge in the isolation regions 214, but also the optical crosstalk, and the focus detection performance can be further improved. Examples of the material with the refractive index lower than the semiconductor substrate 200 include silicon oxide, silicon nitride, silicon oxynitride and silicon carbide when the semiconductor substrate 200 is silicon. The same advantageous effects can be obtained when the inside of the trench is hollow. At least part of the filler can contain a metal material from the viewpoint of increasing the reflection in the interface between the semiconductor substrate 200 and the isolation regions 214.

The filler filling the trenches of the isolation regions 214 may be the same material as the semiconductor substrate 200. When the filler is the same material as the semiconductor substrate 200, the difference between the refractive index of the semiconductor substrate 200 and the refractive index of the isolation regions 214 can be substantially zero. The shape of the light propagating through the semiconductor substrate 200 and the shape of the light propagating through the isolation regions 214 are continuously connected, and the light can be efficiently propagated. As a result, a mode mismatch of light on the surface of the semiconductor substrate 200 can be prevented to reduce the reflection of the incident light, and the reduction in the sensitivity can be prevented. When the semiconductor substrate 200 is silicon, the filler can be single crystalline silicon based on epitaxial growth, polycrystalline silicon or amorphous silicon.

The width W1 of the isolation regions 214 can be equal to or smaller than $\lambda/(4 \times n)$ to further prevent the reduction in the sensitivity. Here, $\lambda$ represents a center wavelength of the incident light, and when a color filter is arranged, λ represents a center wavelength of the light transmitting through the color filter. Further, n represents a refractive index of the isolation regions 214. When the width W1 of the isolation region 214 is equal to or smaller than λ/(4×n), the rate of disturbance of the wave front of the incident light in a wave optical manner can be reduced, and the reduction in the sensitivity can be prevented.

When the trenches of the isolation regions 214 are filled with the filler, liner films made of an insulating material, such as silicon oxide, may be provided on the inner walls of the trenches. The liner films made of an insulating material can be provided on the inner walls of the trenches to form a suitable potential barrier for the isolation regions 214 regardless of the type of insulating material filling the trenches.

In this way, according to the present embodiment, acquisition of an appropriate image according to the amount of received light and improvement of the focus detection accuracy can be realized in the imaging device including a plurality of photoelectric conversion units in one pixel.

Second Embodiment

An imaging device according to a second embodiment of the present invention will be described with reference to FIGS. 7A to 7F. FIGS. 7A to 7F are diagrams illustrating an example of configuration of the pixel of the imaging device according to the present embodiment. The same reference signs are provided to the same constituent elements as in the imaging device according to the first embodiment illustrated in FIGS. 1 to 6B, and the description will not be repeated or will be simplified.

The pixel configuration of the imaging device according to the first embodiment is applied to a backside illuminated imaging device in an example described in the present embodiment.

Figure 7A:
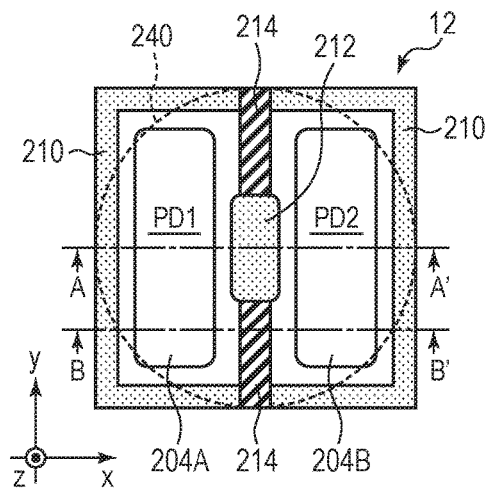
FIGS. 7A, 7B, 7C, 7D, 7E and 7F are diagrams illustrating an example of configuration of the pixel of an imaging device according to a second embodiment of the present invention.
Figure 7B:
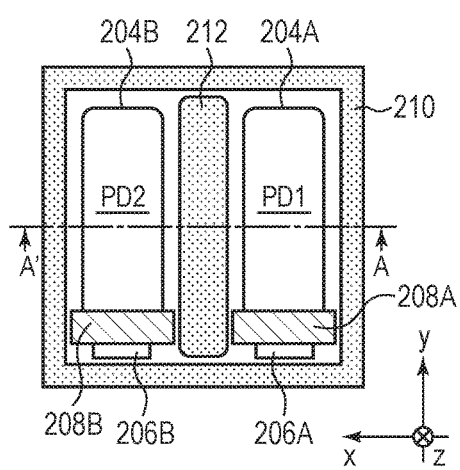
Figure 7C:
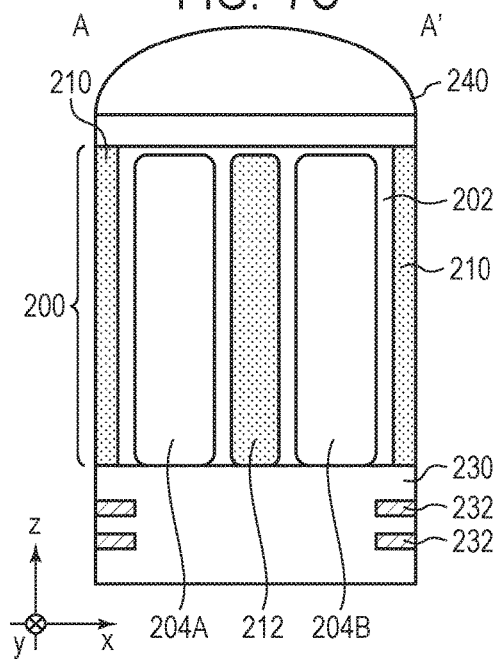
Figure 7D:
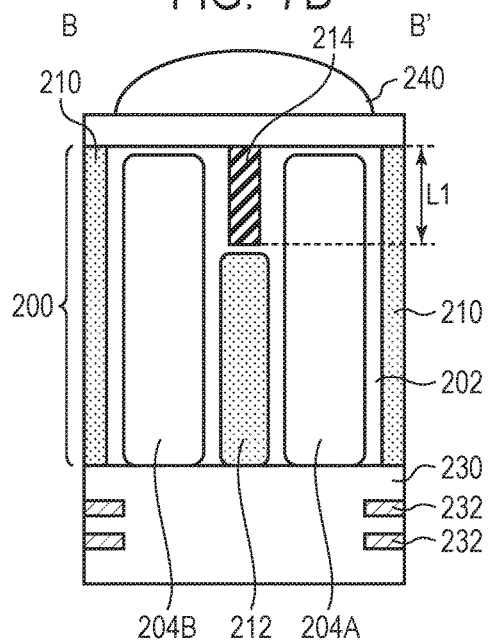

FIGS. 7A to 7D are diagrams illustrating a structure of a part provided with the photoelectric conversion units PD1 and PD2 of the pixel 12 in the imaging device according to the present embodiment. FIG. 7A is a plan view of the semiconductor substrate 200 as viewed from a surface side (backside) in which the light enters. FIG. 7B is a plan view of the semiconductor substrate 200 as viewed from a surface side (front side) opposite the surface in which the light enters. FIG. 7C is a cross-sectional view along the line A-A' of FIG. 7A. FIG. 7D is a cross-sectional view along the line B-B' of FIG. 7A.

The p-type semiconductor region 202 is provided in the semiconductor substrate 200. The n-type semiconductor region 204A forming the charge accumulation unit of the photoelectric conversion unit PD1 and the n-type semiconductor region 204B forming the charge accumulation unit of the photoelectric conversion unit PD2 are provided in the p-type semiconductor region 202. The n-type semiconductor regions 204A and 204B are disposed from the front side (lower side in FIGS. 7C and 7D) to the backside (upper side in FIGS. 7C and 7D) of the semiconductor substrate 200. The n-type semiconductor regions 204A and 204B are formed by, for example, ion implantation of impurities from the front side of the semiconductor substrate 200.

In the front side of the semiconductor substrate 200, the n-type semiconductor region 206A is provided apart from the n-type semiconductor region 204A, and the n-type semiconductor region 206B is provided apart from the n-type semiconductor region 204B as illustrated in FIG. 7B. The gate electrode 208A of the transfer transistor M1 is provided over the surface of the semiconductor substrate 200 between the n-type semiconductor region 204A and the n-type semiconductor region 206A with a gate insulating film (not illustrated) interposed therebetween. The gate electrode 208B of the transfer transistor M2 is provided over the surface of the semiconductor substrate 200 between the n-type semiconductor region 204B and the n-type semiconductor region 206B with a gate insulating film (not illustrated) interposed therebetween.

The isolation region 210 is provided around the region provided with the photoelectric conversion units PD1 and PD2 and the transfer transistors M1 and M2 of the semiconductor substrate 200 so as to surround the region. The isolation region 210 is disposed from the front side to the backside of the semiconductor substrate 200. The isolation region 210 includes a p-type semiconductor region with a carrier concentration higher than the p-type semiconductor region 202. At least part of the isolation region 210 may be an element isolation insulating region formed by the STI method or the like.

The isolation regions 212 and 214 are provided between the region provided with the photoelectric conversion unit PD1 and the transfer transistor M1 and the region provided with the photoelectric conversion unit PD2 and the transfer transistor M2 in the region surrounded by the isolation region 210.

The isolation regions 214 are provided on parts of the backside of the region from the backside (first surface) to the front side (second surface) of the semiconductor substrate 200 as illustrated in FIGS. 7A and 7D. The isolation region 212 is provided on a part between the region provided with the photoelectric conversion unit PD1 and the transfer transistor M1 and the region provided with the photoelectric conversion unit PD2 and the transfer transistor M2, excluding the parts provided with the isolation regions 214. On the backside of the semiconductor substrate 200, the isolation region 212 is arranged around the center of the pixel 12, and the isolation regions 214 are arranged on both ends of the isolation region 212 across the isolation region 212 in the y direction. Therefore, the arrangement of the isolation regions 210, 212 and 214 as viewed from the surface side in which the light enters is the same as in the imaging device according to the first embodiment.

The isolation regions 214 are formed by trench isolations as in the imaging device according to the first embodiment. The isolation region 212 is also made of a semiconductor region forming the potential barrier for the charge accumulation units (n-type semiconductor regions 204A and 204B) of the photoelectric conversion units PD1 and PD2 as in the imaging device according to the first embodiment.

The isolation region 212 is formed by, for example, ion implantation of impurities from the front side of the semiconductor substrate 200. The isolation region 212 is provided from the front side to the backside of the semiconductor substrate 200 in the cross-section of the line A-A' illustrated in FIG. 7C and is provided from the front side of the semiconductor substrate 200 to above the isolation regions 214 in the cross-section of the line B-B' illustrated in FIG. 7D. The isolation region 212 may be formed by ion implantation of impurities from the backside of the semiconductor substrate 200.

In the backside illuminated imaging device, the interconnection layers 232 and the gate electrodes 208A and 208B are formed over the front side of the semiconductor substrate 200. The microlens 240 is arranged over the backside of the semiconductor substrate 200, and the light enters from the backside of the semiconductor substrate 200.

Figure 7E:
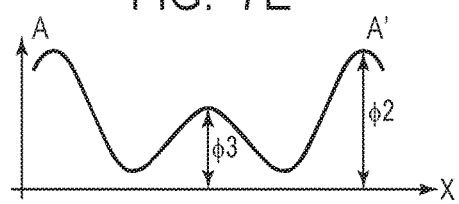
Figure 7F:
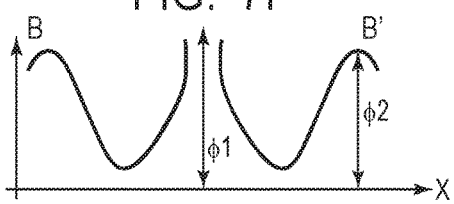

FIG. 7E is a potential distribution diagram depicted by connecting the minimum height of the potential barrier in the region between the backside of the semiconductor substrate 200 and the depth L1 along the cross-section of the line A-A'. FIG. 7F is a potential distribution diagram depicted by connecting the minimum height of the potential barrier in the region between the front surface of the semiconductor substrate 200 and the depth L1 along the cross-section of the line B-B'.

The heights φ1, φ2 and φ3 of the potential barrier are in the following relationship as in the first embodiment, wherein φ1, φ2 and φ3 represent the heights of the potential barrier for the signal charge (electrons) of the isolation regions 214, 210 and 212, respectively.

$$\varphi 3 < \varphi 2 \leq \varphi 1$$

The total length of the lengths of the isolation regions 214 in the y direction on the backside of the semiconductor substrate 200 is defined as T1, the width in the x direction is defined as W1, the length of the isolation region 212 in the y direction is defined as T3, the width in the x direction is defined as W3, and the width of the isolation region 210 in the x direction is defined as W2. In this case, it is desirable that the lengths T1 and T3 and the widths W1, W2 and W3 are in the following relationship as in the first embodiment.

$$T3 \leq T1, W3 > W1, W3 > W2$$

When the photoelectric conversion units PD1 and PD2 are isolated only by the p-n junction isolation, it is difficult to realize all three of "favorable focus detection performance", "combined output without knee characteristic" and "sufficient saturation charge amount" at the same time for the same reason as the reason described in the first embodiment. Particularly, in the backside illuminated imaging device, the isolation region 212 is formed between the photoelectric conversion units PD1 and PD2 through the ion implantation of impurities from the front side of the semiconductor substrate 200, and the impurities further spread in the lateral direction on the backside. Although the height of the potential barrier is increased by increasing the carrier concentration between the photoelectric conversion units PD1 and PD2, the spread in the lateral direction is further increased. The volume of the photoelectric conversion units PD1 and PD2 is reduced, and the saturation charge amount is reduced. If the potential barrier between the photoelectric conversion units PD1 and PD2 is too high, the combined output may have a knee characteristic as described in the first embodiment. Conversely, if the carrier concentration between the photoelectric conversion units PD1 and PD2 is too low, the height of the potential barrier is reduced, and the focus detection performance may be deteriorated as described in the first embodiment.

The problems can be solved by using the isolation region 212 and the isolation regions 214 to isolate the photoelectric conversion units PD1 and PD2 on the backside of the semiconductor substrate 200 as in the configuration of the present embodiment. More specifically, when the isolation regions 214 are provided, the height φ1 of the potential barrier of the isolation regions 214 becomes significantly high, and the isolation regions 214 substantially completely block the movement of the charge (see FIG. 7F). When a gap is provided between the isolation regions 214 on the backside of the semiconductor substrate 200, the height φ3 of the potential barrier becomes low (see FIG. 7E), and the charge can pass through the gap to move between the photoelectric conversion units PD1 and PD2. The gap, that is, the height φ3 of the potential barrier of the isolation region 212, can be designed by the interval T3, the width W3 and the carrier concentration of the isolation region 212. As a result, the relationship of expression (1) is satisfied, and all three of "favorable focus detection performance", "combined output without knee characteristic" and "sufficient saturation charge amount" can be realized at the same time.

In this way, according to the present embodiment, acquisition of an appropriate image according to the amount of received light and improvement of the focus detection accuracy can be realized in the backside illuminated imaging device including pixels provided with a plurality of photoelectric conversion units.

Third Embodiment

Figure 8A:
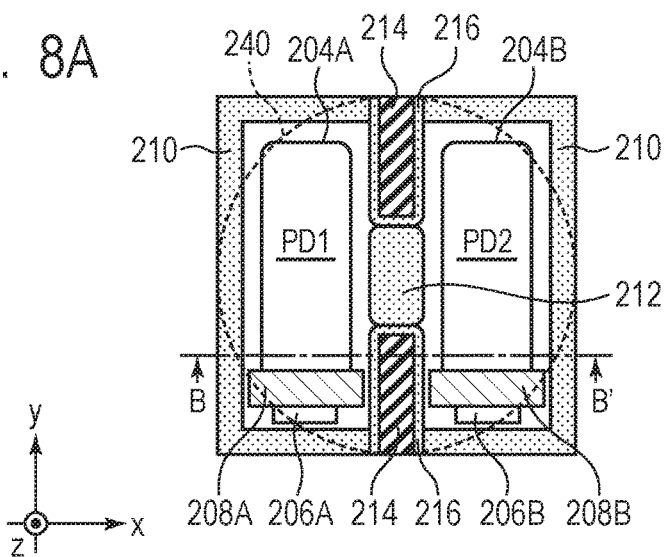
FIGS. 8A, 8B and 8C are diagrams illustrating an example of configuration of the pixel of an imaging device according to a third embodiment of the present invention.
Figure 8B:
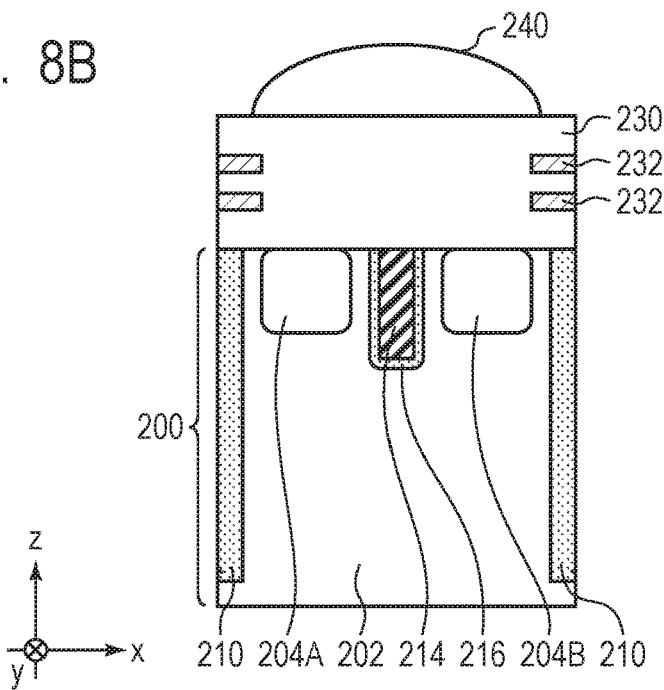
Figure 8C:
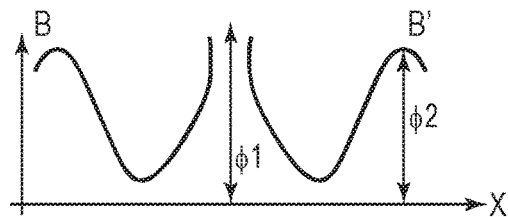

An imaging device according to a third embodiment of the present invention will be described with reference to FIGS. 8A to 8C. FIGS. 8A to 8C are diagrams illustrating an example of configuration of the pixel of the imaging device according to the present embodiment. The same reference signs are provided to the same constituent elements as in the imaging devices according to the first and second embodiments illustrated in FIGS. 1 to 7F, and the description will not be repeated or will be simplified.

FIGS. 8A to 8C are diagrams illustrating a structure of a part provided with the photoelectric conversion units PD1 and PD2 of the pixel 12 in the imaging device according to the present embodiment. FIG. 8A is a plan view of the photoelectric conversion units PD1 and PD2 as viewed from the light incident direction. FIG. 8B is a cross-sectional view along the line B-B' of FIG. 7A. FIG. 8C is a potential distribution diagram depicted by connecting the minimum height of the potential barrier in the region between the surface of the semiconductor substrate 200 and the depth L1 along the cross-section of the line B-B'.

As illustrated in FIGS. 8A to 8C, the imaging device according to the present embodiment is the same as the imaging device according to the first embodiment, except that the imaging device further includes p-type semiconductor regions 216 around the isolation regions 214. The p-type semiconductor regions 216 are semiconductor regions of a conductivity type opposite the charge accumulation units (n-type semiconductor regions 204A and 204B) of the photoelectric conversion units PD1 and PD2. The regions are n-type semiconductor regions when the charge accumulation units of the photoelectric conversion units PD1 and PD2 are p-type semiconductor regions.

Providing the p-type semiconductor regions 216 around the isolation regions 214 can reduce the noise generated around the boundary of the isolation regions 214 formed by digging the trenches on the semiconductor substrate 200.

Fourth Embodiment

Figure 9A:
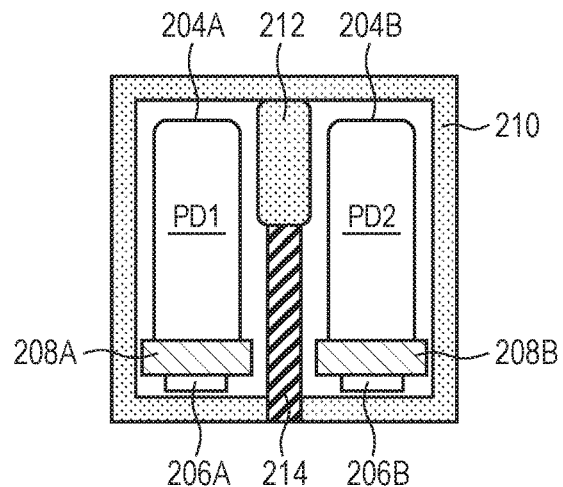
FIGS. 9A, 9B and 9C are diagrams illustrating an example of configuration of the pixel of an imaging device according to a fourth embodiment of the present invention.
Figure 9B:
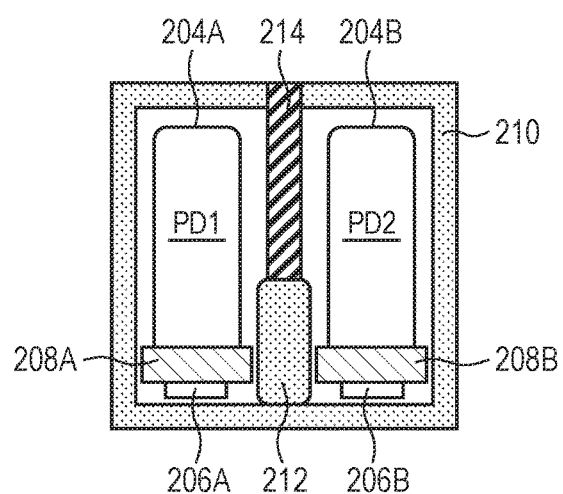
Figure 9C:
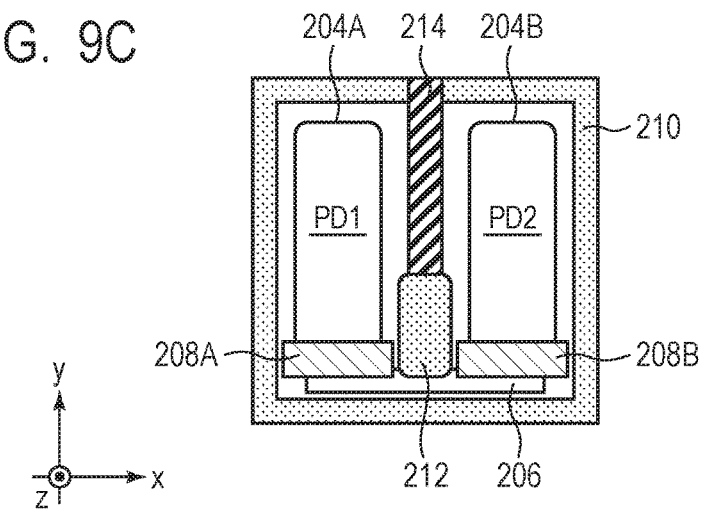

An imaging device according to a fourth embodiment of the present invention will be described with reference to FIGS. 9A to 9C. FIGS. 9A to 9C are diagrams illustrating an example of configuration of the pixel of the imaging device according to the present embodiment. The same reference signs are provided to the same constituent elements as in the imaging devices according to the first to third embodiments illustrated in FIGS. 1 to 8C, and the description will not be repeated or will be simplified.

In the imaging device according to the first embodiment, the isolation regions 214 are arranged on both ends of the isolation region 212 across the isolation region 212 in the y direction, and the isolation regions 214 are arranged around the center of the pixel 12. However, the arrangement of the isolation regions 214 is not limited to this. Although the arrangement of the isolation regions 214 at the center of the pixel 12 is a desirable mode, it is only necessary that at least part of the regions is positioned between the photoelectric conversion unit PD1 and the photoelectric conversion unit PD2 from the viewpoint of allowing the movement of the charge between the photoelectric conversion unit PD1 and the photoelectric conversion unit PD2.

Therefore, the isolation regions 214 may not be arranged on both ends of the isolation region 212 as illustrated for example in FIGS. 9A and 9B. FIG. 9A illustrates an example in which the isolation region 214 is arranged closer to the gate electrodes 208A and 208B. FIG. 9B illustrates an example in which the isolation region 212 is arranged closer to the gate electrodes 208A and 208B.

As illustrated for example in FIG. 9C, a gap may be provided between the isolation region 212 and the isolation region 210 in the arrangement of FIG. 9B. In this case, the n-type semiconductor region 206A and the n-type semiconductor region 206B may be connected by the gap to form one n-type semiconductor region 206.

When the floating diffusion region FD includes two n-type semiconductor regions 206A and 206B as in FIG. 9B, two contact plugs are necessary to provide interconnection connected to the regions. On the other hand, when the floating diffusion region FD includes one n-type semiconductor region 206 as in FIG. 9C, one contact plug is necessary. Therefore, the capacitance generated between the contact plugs can be reduced, and the noise can be reduced.

A gap may be provided between the isolation region 212 and the isolation region 210 in the arrangement of FIG. 9A, and the n-type semiconductor region 206A and the n-type semiconductor region 206B may be connected by the gap to form one n-type semiconductor region 206.

Fifth Embodiment

An imaging device according to a fifth embodiment of the present invention will be described with reference to FIGS. 10A to 10D. FIGS. 10A to 10D are diagrams illustrating an example of configuration of the pixel of the imaging device according to the present embodiment. The same reference signs are provided to the same constituent elements as in the imaging device according to the first to fourth embodiments illustrated in FIGS. 1 to 9C, and the description will not be repeated or will be simplified.

In the example illustrated for the imaging device according to the first embodiment, the isolation region 212 is arranged around the center of the pixel 12 from the viewpoint of arranging the isolation region 212 at a location where the light entered from the microlens 240 is most concentrated. However, the incident angle (principal ray angle) of the light incident on the pixel 12 varies depending on the position of the pixel 12 in the pixel region 10. Therefore, when the isolation region 212 is arranged based on the viewpoint, it is desirable to change the locations of the arrangement of the isolation region 212 in the pixel 12 according to the position of the pixel 12 in the pixel region 10. In an example illustrated in the present embodiment, the location of the arrangement of the isolation region 212 in the pixel is set according to the location of the pixel 12 positioned in the pixel region 10.

Although the location where the light incident on the pixel 12 is most concentrated depends on the relationship between the size of the pixel array and the size of the microlens array and the like, the farther the pixel 12 from the center of the pixel region 10, the more the location where the light is most concentrated shifts in the direction in which the pixel 12 is positioned relative to the center of the pixel region 10, for example. In such a case, the isolation region 212 can be arranged as illustrated for example in FIGS. 10A to 10D according to the location of the pixel 12 in the pixel region 10.

Here, as illustrated in FIG. 10A, locations (1), (2) and (3) in the pixel region 10 will be described. The location (1) is near the center of the pixel region 10. The location (2) is near the circumference (near the center of the upper side) positioned in the +y direction with respect to the center of the pixel region 10. The location (3) is near the corner (near the upper right corner) positioned in the +x direction and the +y direction with respect to the center of the pixel region 10. In this case, layouts of the pixels 12 at the locations (1), (2) and (3) can be as illustrated in FIGS. 10B, 10C and 10D, respectively.

At the location near the center of the pixel region 10 (location (1)), the isolation region 212 is arranged near the center of the pixel 12 as illustrated in FIG. 10B, as in the first embodiment. From the center to the circumference of the pixel region 10, the position of the isolation region 212 is gradually shifted. At the location near the center of the upper side of the pixel region 10 (location (2)), the isolation region 212 is shifted in the +y direction from the position in the pixel 12 at the location (1) as illustrated in FIG. 10C. At the location near the upper right corner of the pixel region 10 (location (3)), the isolation region 212 is shifted in the +x direction from the position in the pixel at the location (2) as illustrated in FIG. 10D. The locations of arrangement of the isolation regions 214, the photoelectric conversion units PD1 and PD2, the transfer transistors M1 and M2 and the like may be moved according to the movement of the isolation region 212 (see FIG. 10D).

In this way, the light is concentrated on the locations of arrangement of the isolation region 212, and a reduction in the sensitivity at the circumference of the pixel region 10 can be particularly prevented.

Sixth Embodiment

An imaging device according to a sixth embodiment of the present invention will be described with reference to FIGS. 11A to 11E. The same reference signs are provided to the same constituent elements as in the imaging devices according to the first to fifth embodiments illustrated in FIGS. 1 to 10D, and the description will not be repeated or will be simplified.

Figure 11A:
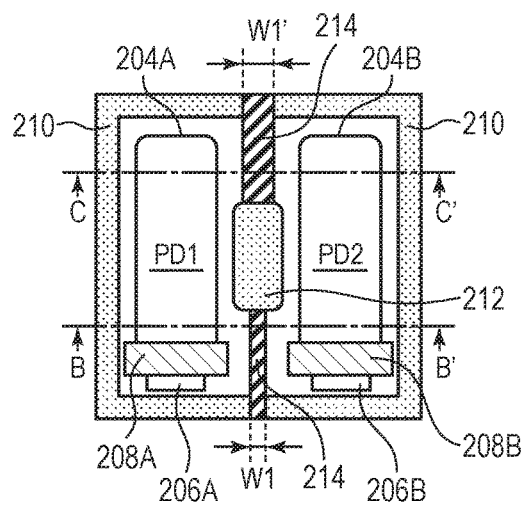
FIGS. 11A, 11B, 11C, 11D and 11E are diagrams illustrating an example of configuration of the pixel of an imaging device according to a sixth embodiment of the present invention.
Figure 11B:
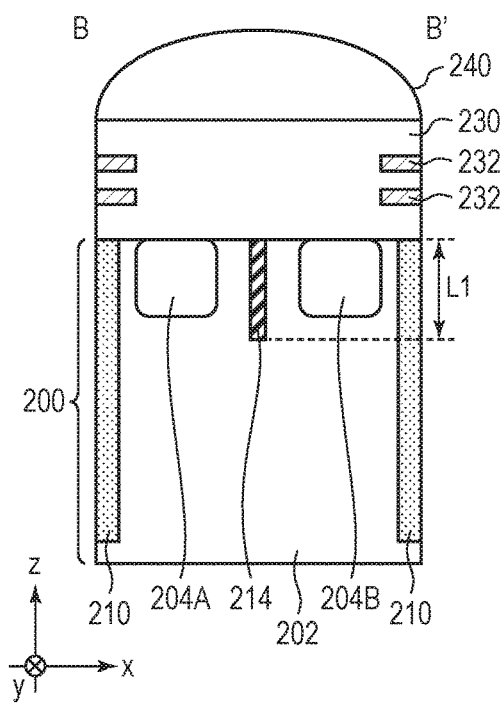
Figure 11C:
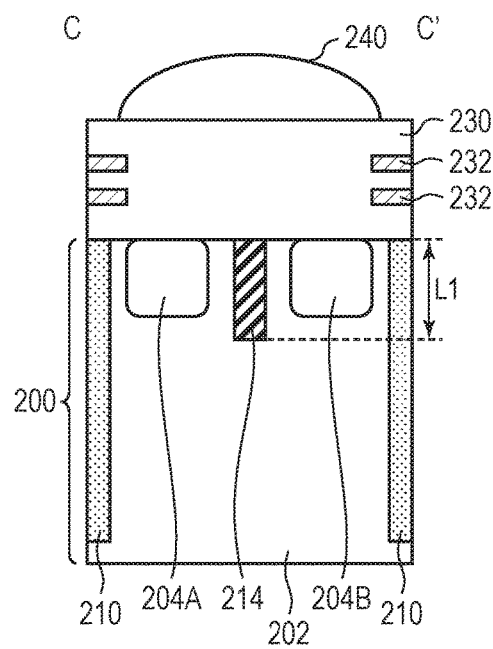
Figure 11D:
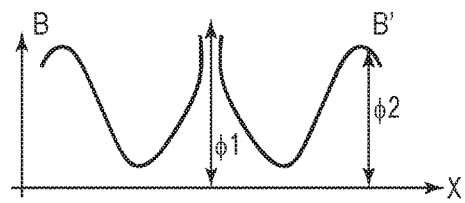
Figure 11E:
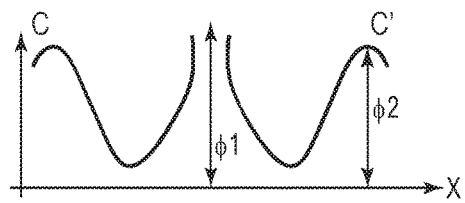

FIGS. 11A to 11E are diagrams illustrating an example of configuration of the pixel of the imaging device according to the present embodiment. FIG. 11A is a plan view of the photoelectric conversion units PD1 and PD2 as viewed from the light incident direction. FIG. 11B is a cross-sectional view along the line B-B' of FIG. 11A. FIG. 11C is a cross-sectional view along a line C-C' of FIG. 11A. FIG. 11D is a potential distribution diagram depicted by connecting the minimum height of the potential barrier in the region between the backside of the semiconductor substrate 200 and the depth L1 along the cross-section of the line B-B'. FIG. 11E is a potential distribution diagram depicted by connecting the minimum height of the potential barrier in the region between the front side of the semiconductor substrate 200 and the depth L1 along the cross-section of the line C-C'.

The imaging device according to the present embodiment is the same as the imaging device according to the first embodiment, except that the width of the isolation region 214 varies depending on the location. More specifically, the widths of the two isolation regions 214 across the isolation region 212 are different from each other in the imaging device according to the present embodiment. In the two isolation regions 214, a width W1 is narrower than a width W1', wherein W1 represents the width of the isolation region 214 arranged closer to the gate electrodes 208A and 208B, and W1' represents a width of the isolation region 214 arranged farther from the gate electrodes 208A and 208B.

When the width W1 of the isolation region 214 is narrower than the width W1', the width of the gate electrodes 208A and 208B in the x direction and the width of the floating diffusion regions FD (n-type semiconductor regions 206A and 206B) in the x direction can be increased. This can expand the width of the transfer path of the charge to increase the degree of freedom of the design and can improve the transfer characteristics while further increasing the saturation charge amount of the photoelectric conversion units PD1 and PD2. The isolation regions 214 made of the trench isolations can obtain sufficient isolation characteristics even when the width is narrowed down, and the photoelectric conversion units PD1 and PD2 can be clearly isolated as in the first embodiment. Therefore, all three of "favorable focus detection performance", "combined output without knee characteristic" and "sufficient saturation charge amount" can be realized at the same time for the reason described in the first embodiment.

Although the width W1 is narrower than the width W1' in the present embodiment, the width W1' may be narrower than the width W1.

Seventh Embodiment

An imaging device according to a seventh embodiment of the present invention will be described with reference to FIG. 12. The same reference signs are provided to the same constituent elements as in the imaging devices according to the first to sixth embodiments illustrated in FIGS. 1 to 11E, and the description will not be repeated or will be simplified.

Figure 12:
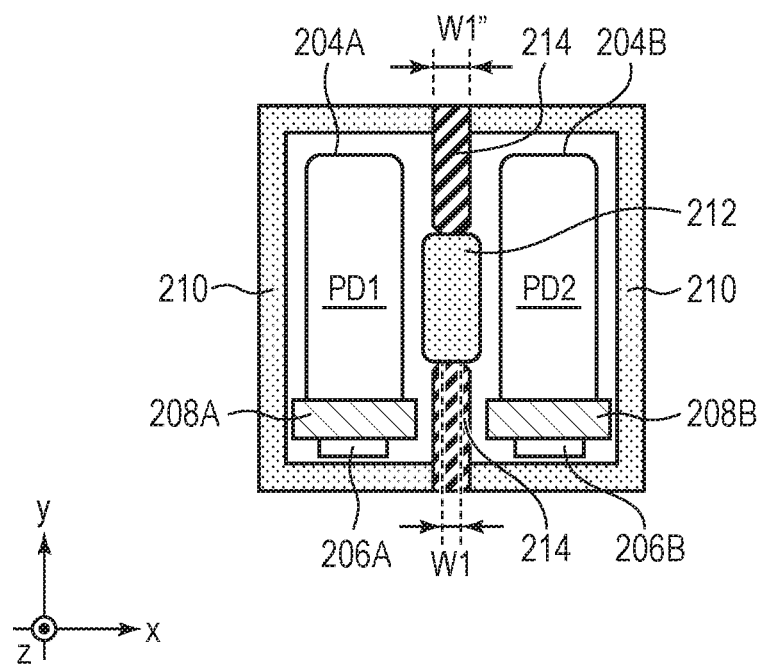
FIG. 12 is a diagram illustrating an example of configuration of the pixel of an imaging device according to a seventh embodiment of the present invention.

FIG. 12 is a plan view of the photoelectric conversion units PD1 and PD2 of the imaging device according to the present embodiment as viewed from the light incident direction.

The imaging device according to the present embodiment is the same as the imaging device according to the first embodiment, except that the width of the isolation regions 214 changes along the way. More specifically, the width of the isolation regions 214 varies between the part close to the isolation region 212 and the part far from the isolation region 212 in the imaging device according to the present embodiment. A width W1 is narrower than a width W1", wherein the width W1 represents the width of the isolation regions 214 of the part close to the isolation region 212, and W1" represents the width of the isolation regions 214 of the part far from the isolation region 212. When the width of the isolation regions 214 changes along the way, the shape of the potential of the isolation regions 214 can be adjusted to adjust the height φ3 of the potential barrier.

Although the width of the isolation regions 214 is gradually narrowed down toward the boundary with the isolation region 212 such that W1 is smaller than W1" in FIG. 12, the width may be gradually expanded such that W1 is greater than W1".

Eighth Embodiment

Figure 13:
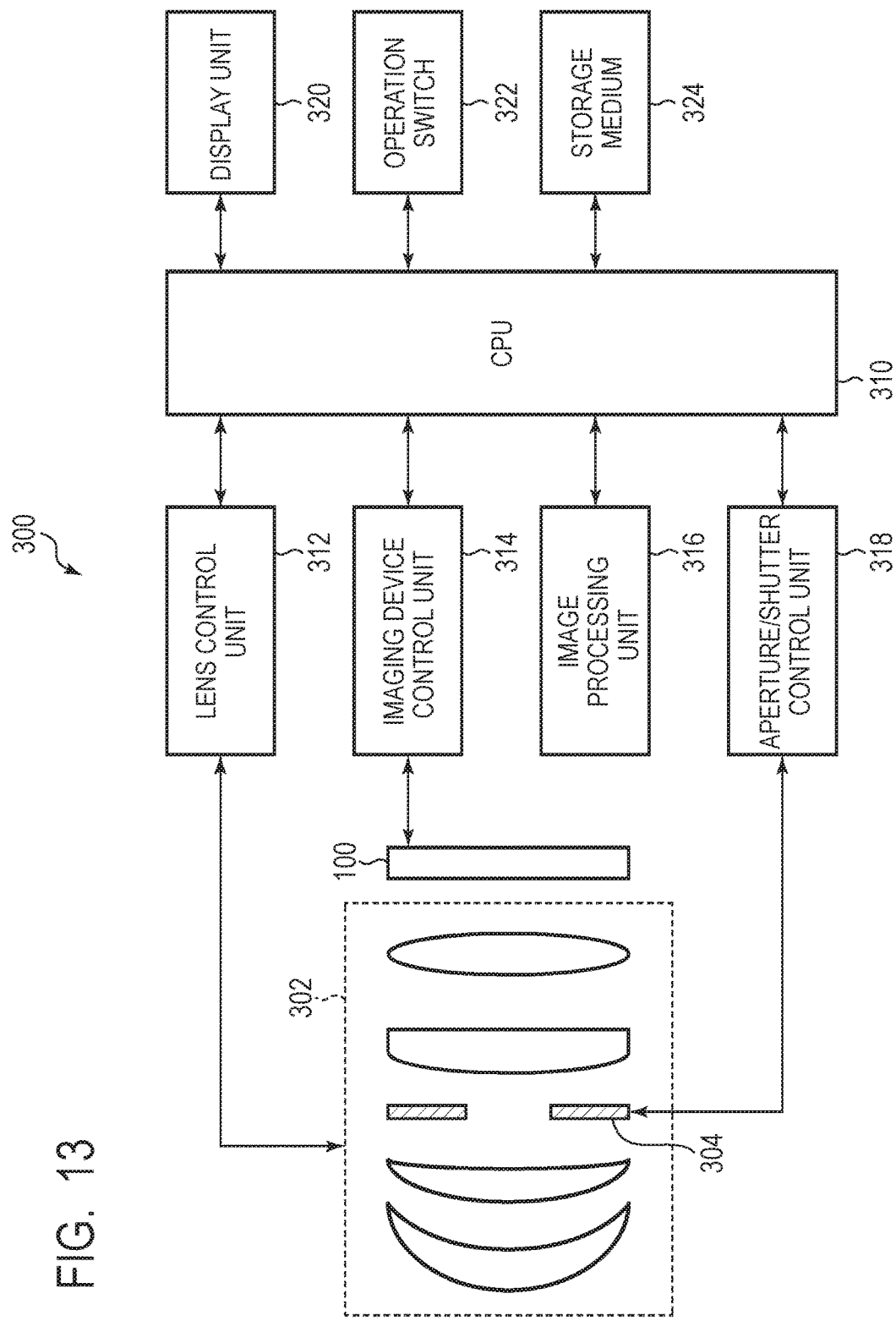
FIG. 13 is a block diagram illustrating a schematic configuration of an imaging system according to an eighth embodiment of the present invention.

An imaging system according to an eighth embodiment of the present invention will be described with reference to FIG. 13. FIG. 13 is a block diagram illustrating a schematic configuration of the imaging system according to the present embodiment. The same reference signs are provided to the same constituent elements as in the imaging devices illustrated in FIGS. 1 to 12, and the description will not be repeated or will be simplified.

The imaging device 100 described in the first to seventh embodiments can be applied to various imaging systems. Examples of the imaging system that can be applied include, but not particularly limited to, a digital still camera, a digital camcorder, a surveillance camera, a copying machine, a facsimile, a mobile phone, an in-vehicle camera and an observation satellite. A camera module including an optical system, such as a lens, and an imaging device is also included in the imaging systems. FIG. 13 illustrates a block diagram of a digital still camera as an example of the imaging systems.

As illustrated in FIG. 13, an imaging system 300 includes an imaging optical system 302, a CPU 310, a lens control unit 312, an imaging device control unit 314, an image processing unit 316, an aperture/shutter control unit 318, a display unit 320, an operation switch 322 and a storage medium 324.

The imaging optical system 302 is an optical system that forms an optical image of an object, and the imaging optical system 302 includes a lens group, an aperture 304 and the like. The aperture 304 has a function of adjusting the opening size to adjust the amount of light during imaging and has a function of a shutter for adjusting the exposure time during imaging of a still image. The lens group and the aperture 304 are held such that the lens group and the aperture 304 can move back and forth in the optical axis direction, and a magnification function (zoom function) and a focus adjustment function are realized by associated operation of the lens group and the aperture 304. The imaging optical system 302 may be integrated with the imaging system or may be an imaging lens that can be mounted on the imaging system.

The imaging device 100 is arranged such that the imaging surface is positioned in the image space of the imaging optical system 302. The imaging device 100 is the imaging device 100 described in the first to seventh embodiments and includes a CMOS sensor (pixel region 10) and peripheral circuits (peripheral circuit regions) of the CMOS sensor. Pixels including a plurality of photoelectric conversion units are two-dimensionally arranged in the imaging device 100, and color filters are arranged on the pixels to form a two-dimensional single-plate color sensor. The imaging device 100 photoelectrically converts the object image formed by the imaging optical system 302 and outputs an image signal or a focus detection signal.

The lens control unit 312 controls the forward and backward drive of the lens group of the imaging optical system 302 to perform magnification operation or focus adjustment and includes a circuit or a processing device configured to realize the functions. The aperture/shutter control unit 318 changes the opening size of the aperture 304 (aperture value is variable) to adjust the amount of imaging light and includes a circuit or a processing device configured to realize the functions.

The CPU 310 is a control device in the camera configured to manage various types of control of the camera body and includes an operation unit, a ROM, a RAM, an A/D converter, a D/A converter and a communication interface circuit. The CPU 310 controls operation of the components in the camera according to a computer program stored in the ROM or the like and executes a series of imaging operations, such as AF including detection of the focus state (focus detection) of the imaging optical system 302, imaging, image processing and recording. The CPU 310 is also a signal processing unit.

The imaging device control unit 314 controls operation of the imaging device 100 and performs A/D conversion of the signal output from the imaging device 100 to transmit the signal to the CPU 310. The imaging device control unit 314 includes a circuit or a control device configured to realize the functions. The imaging device 100 may have the A/D conversion function. The image processing unit 316 generates an image signal by applying image processing, such as γ conversion and color interpolation, to the signal after the A/D conversion and includes a circuit or a control device configured to realize the functions. The display unit 320 is a display device, such as a liquid crystal display device (LCD), and displays information related to the imaging mode of the camera, a preview image before imaging, a confirmation image after imaging and a focus state during focus detection. The operation switch 322 includes a power supply switch, a release (imaging trigger) switch, a zoom operation switch and an imaging mode selection switch. The storage medium 324 stores taken images. The storage medium 324 may be built in the imaging system or may be a removable medium, such as a memory card.

In this way, the configuration of the imaging system 300 applying the imaging device 100 according to the first to seventh embodiments can realize a high-performance imaging system capable of highly accurate focus adjustment and capable of acquiring a high-definition image.

Modified Embodiments

The present invention is not limited to the embodiments, and various modifications can be made.

For example, the first and second embodiments have illustrated that the heights of the potential barrier for the signal charge of the isolation regions 214, 210 and 212 are $\phi1$, $\phi2$ and $\phi3$, respectively, and it is desirable that the heights are in the relationship of $\phi3<\phi2\leq\phi1$. However, when the outflow of charge to the adjacent pixel can be ignored, such as when the interval between the pixel and the adjacent pixel is sufficient, only the relationship between the height $\phi1$ of the potential barrier of the isolation regions 214 and the height $\phi3$ of the potential barrier of the isolation region 212 may be taken into account. In this case, $\phi3$ is smaller than $\phi1$.

The pixel circuit illustrated in FIG. 2 is an example, and the pixel circuit is not limited to this. For example, although the two photoelectric conversion units PD1 and PD2 share the readout circuit unit (reset transistor M3, amplifier transistor M4 and select transistor M5) in the pixel circuit of FIG. 2, the readout circuit unit may be provided for each of the two photoelectric conversion units PD1 and PD2.

In the embodiments, although the modified examples of the imaging device according to the first embodiment are described in the third to seventh embodiments, the additional configurations described in the embodiments can also be applied to the imaging device according to the second embodiment. Two or more additional configurations described in the third to seventh embodiments can also be arbitrarily combined.

The imaging system illustrated in the eighth embodiment is an example of an imaging system in which the imaging device of the present invention can be applied, and the imaging system in which the imaging device of the present invention can be applied is not limited to the configuration illustrated in FIG. 13.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-104823, filed May 26, 2016, which is hereby incorporated by reference herein in its entirety.

What is claimed is:

1. An imaging device comprising a plurality of pixels two-dimensionally disposed,
at least part of the plurality of pixels including:
a first photoelectric conversion unit and a second photoelectric conversion unit provided in a semiconductor substrate and each including a first semiconductor region of a first conductivity type for accumulating a signal charge generated by photoelectric conversion;
a first isolation region provided in the semiconductor substrate between the first photoelectric conversion unit and the second photoelectric conversion unit and including a second semiconductor region forming a first potential barrier for the signal charge between the first semiconductor region of the first photoelectric conversion unit and the first semiconductor region of the second photoelectric conversion unit; and
a second isolation region provided in the semiconductor substrate between the first photoelectric conversion unit and the second photoelectric conversion unit and including a trench isolation forming a second potential barrier higher than the first potential barrier for the signal charge between the first semiconductor region of the first photoelectric conversion unit and the first semiconductor region of the second photoelectric conversion unit,
wherein the first photoelectric conversion unit and the second photoelectric conversion unit are arranged adjacent to each other in a first direction in a plan view,
wherein the first isolation region and the second isolation region are arranged adjacent to each other in a second direction intersecting the first direction in the plan view,
wherein the trench isolation comprises an insulating material, and
wherein the first isolation region does not include the trench isolation.

2. The imaging device according to claim 1, wherein the at least part of the plurality of pixels includes two second isolation regions, and
the two second isolation regions are arranged across the first isolation region in the second direction.

3. The imaging device according to claim 1, wherein the first isolation region is arranged at a center of the pixel in the plan view.

4. The imaging device according to claim 1, wherein a location of the first isolation region in the pixel is set according to a location of the pixel in a pixel region.

5. The imaging device according to claim 1, wherein a length of the first isolation region in a plan view is equal to or smaller than a length of the second isolation region in the plan view.

6. The imaging device according to claim 1, wherein a width of the second isolation region in a plan view is narrower than a width of the first isolation region in the plan view.

7. The imaging device according to claim 1, wherein the at least part of the plurality of pixels further includes a third isolation region provided between another adjacent pixel and the first photoelectric conversion unit, and
a potential barrier of the third isolation region for the signal charge between the first semiconductor region of the first photoelectric conversion unit of one pixel and the first semiconductor region of the second photoelectric conversion unit of the another adjacent pixel is higher than the first potential barrier.

8. The imaging device according to claim 7, wherein a width of the third isolation region in a plan view is wider than the width of the first isolation region in the plan view.

9. The imaging device according to claim 7, wherein at least part of the third isolation region is a trench isolation.

10. The imaging device according to claim 7, wherein the third isolation region is provided throughout a depth deeper than a depth from a first surface of the semiconductor substrate to the location where each of the first semiconductor regions of the first and second photoelectric conversion units, the first isolation region and the second isolation region are provided.

11. The imaging device according to claim 7, wherein the second semiconductor region is a second conductivity type, and
the third isolation region includes a third semiconductor region of the second conductivity type with a carrier concentration higher than the second semiconductor region.

12. The imaging device according to claim 1, wherein the second semiconductor region is the first conductivity type, and
a carrier concentration of the second semiconductor region is lower than a carrier concentration of the first semiconductor region.

13. The imaging device according to claim 1, further comprising:
a fourth semiconductor region of the second conductivity type around the second isolation region, wherein a carrier concentration of the fourth semiconductor region is higher than a carrier concentration of the second semiconductor region.

14. The imaging device according to claim 1, wherein the insulating material is selected from among silicon oxide, silicon nitride, silicon oxynitride and silicon carbide.

15. The imaging device according to claim 1, wherein the first isolation region and the second isolation region are provided throughout a depth deeper than the depth from a first surface of the semiconductor substrate to the location where each of the first semiconductor regions of the first and second photoelectric conversion units is provided.

16. The imaging device according to claim 1, wherein the semiconductor substrate includes a first surface and a second surface,
the first isolation region is provided from the first surface to the second surface of the semiconductor substrate, and
the second isolation region is provided on a part closer to the first surface in the region from the first surface to the second surface of the semiconductor substrate.

17. The imaging device according to claim 15, wherein the at least part of the plurality of pixels further includes one microlens closer to the first surface of the semiconductor substrate, the microlens configured to condense light on the first photoelectric conversion unit and the second photoelectric conversion unit.

18. An imaging system comprising:
an imaging device including a plurality of pixels two-dimensionally disposed, at least part of the plurality of pixels including:
a first photoelectric conversion unit and a second photoelectric conversion unit provided in a semiconductor substrate and each including a first semiconductor region of a first conductivity type for accumulating a signal charge generated by photoelectric conversion;
a first isolation region provided in the semiconductor substrate between the first photoelectric conversion unit and the second photoelectric conversion unit and including a second semiconductor region forming a first potential barrier for the signal charge between the first semiconductor region of the first photoelectric conversion unit and the first semiconductor region of the second photoelectric conversion unit; and
a second isolation region provided in the semiconductor substrate between the first photoelectric conversion unit and the second photoelectric conversion unit and including a trench isolation forming a second potential barrier higher than the first potential barrier for the signal charge between the first semiconductor region of the first photoelectric conversion unit and the first semiconductor region of the second photoelectric conversion unit,
wherein the first photoelectric conversion unit and the second photoelectric conversion unit are arranged adjacent to each other in a first direction in a plan view,
wherein the first isolation region and the second isolation region are arranged adjacent to each other in a second direction intersecting the first direction in the plan view,
wherein the trench isolation comprises an insulating material, and
wherein the first isolation region does not include the trench isolation; and
a signal processing unit that processes a signal output from the imaging device,
wherein the signal processing unit calculates a defocus amount based on a first signal based on a signal charge generated by the first photoelectric conversion unit and a second signal based on a signal charge generated by the second photoelectric conversion unit.

19. The imaging system according to claim 18, wherein the signal processing unit generates an image based on a third signal based on a signal charge generated by the first photoelectric conversion unit and the second photoelectric conversion unit.

20. An imaging device comprising a plurality of pixels two-dimensionally disposed,
at least part of the plurality of pixels including:
a first photoelectric conversion unit and a second photoelectric conversion unit provided in a semiconductor substrate and each including a first semiconductor region of a first conductivity type for accumulating a signal charge generated by photoelectric conversion;
a first isolation region provided in the semiconductor substrate between the first photoelectric conversion unit and the second photoelectric conversion unit and including a second semiconductor region forming a first potential barrier for the signal charge between the first semiconductor region of the first photoelectric conversion unit and the first semiconductor region of the second photoelectric conversion unit; and a second isolation region provided in the semiconductor substrate between the first photoelectric conversion unit and the second photoelectric conversion unit and including a trench isolation forming a second potential barrier higher than the first potential barrier for the signal charge between the first semiconductor region of the first photoelectric conversion unit and the first semiconductor region of the second photoelectric conversion unit, wherein the first photoelectric conversion unit and the second photoelectric conversion unit are arranged adjacent to each other in a first direction in a plan view, wherein the first isolation region and the second isolation region are arranged adjacent to each other in a second direction intersecting the first direction in the plan view, wherein the at least part of the plurality of pixels includes two second isolation regions, and wherein the two second isolation regions are arranged across the first isolation region in the second direction.

21. An imaging device comprising a plurality of pixels two-dimensionally disposed, at least part of the plurality of pixels including a first photoelectric conversion unit and a second photoelectric conversion unit provided in a semiconductor substrate and each including a first semiconductor region of a first conductivity type for accumulating a signal charge generated by photoelectric conversion;

a first isolation region provided in the semiconductor substrate between the first photoelectric conversion unit and the second photoelectric conversion unit and including a second semiconductor region forming a first potential barrier for the signal charge between the first semiconductor region of the first photoelectric conversion unit and the first semiconductor region of the second photoelectric conversion unit; and a second isolation region provided in the semiconductor substrate between the first photoelectric conversion unit and the second photoelectric conversion unit and including a trench isolation forming a second potential barrier higher than the first potential barrier for the signal charge between the first semiconductor region of the first photoelectric conversion unit and the first semiconductor region of the second photoelectric conversion unit, wherein the first photoelectric conversion unit and the second photoelectric conversion unit are arranged adjacent to each other in a first direction in a plan view, wherein the first isolation region and the second isolation region are arranged adjacent to each other in a second direction intersecting the first direction in the plan view, wherein the first isolation region is arranged at a center of the pixel in the plan view.

* * * * *